(12) United States Patent
Nakayama et al.

(10) Patent No.: US 8,018,242 B2
(45) Date of Patent: Sep. 13, 2011

(54) PROBE CARD

(75) Inventors: Hiroshi Nakayama, Nagano (JP);
Mitsuhiro Nagaya, Nagano (JP); Yoshio Yamada, Nagano (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 395 days.

(21) Appl. No.: 12/086,031

(22) PCT Filed: Dec. 4, 2006

(86) PCT No.: PCT/JP2006/324183
§ 371 (c)(1),
(2), (4) Date: May 11, 2009

(87) PCT Pub. No.: WO2007/066622
PCT Pub. Date: Jun. 14, 2007

(65) Prior Publication Data
US 2009/0219043 A1    Sep. 3, 2009

(30) Foreign Application Priority Data

Dec. 5, 2005 (JP) ................................. 2005-351304

(51) Int. Cl.
*G01R 1/00* (2006.01)
(52) U.S. Cl. .................................. 324/755.01
(58) Field of Classification Search .................. None
See application file for complete search history.

(56) References Cited

U.S. PATENT DOCUMENTS

| 6,043,666 | A | 3/2000 | Kazama | |
|---|---|---|---|---|
| 7,057,403 | B2 * | 6/2006 | Kazama | 324/755.05 |
| 7,071,715 | B2 * | 7/2006 | Shinde et al. | 324/756.03 |
| 7,459,922 | B2 * | 12/2008 | Kazama | 324/755.05 |
| 7,667,472 | B2 * | 2/2010 | Miura et al. | 324/750.16 |
| 7,772,858 | B2 * | 8/2010 | Sasaki et al. | 324/756.03 |
| 7,795,892 | B2 * | 9/2010 | Yamada et al. | 324/756.03 |
| 7,898,272 | B2 * | 3/2011 | Sasaki et al. | 324/756.03 |
| 2004/0104738 | A1 * | 6/2004 | Mori | 324/754 |
| 2005/0237070 | A1 * | 10/2005 | Kazama | 324/754 |

(Continued)

FOREIGN PATENT DOCUMENTS

JP   63-293845   11/1988

(Continued)

OTHER PUBLICATIONS

International Search Report mailed Mar. 20, 2007, issued on PCT/JP2006/324183.

(Continued)

*Primary Examiner* — Jermele M Hollington
(74) *Attorney, Agent, or Firm* — Edwards Angell Palmer & Dodge LLP

(57) ABSTRACT

A probe card includes probes that are made of a conductive material and come into contact with a semiconductor wafer to receive or output an electric signal; a probe head that holds the probes; a substrate that has a wiring pattern corresponding to a circuit structure for generating a signal for a test; a reinforcing member that reinforces the substrate; an interposer that is stacked on the substrate for connection of wires of the substrate; a space transformer that is stacked between the interposer and the probe head and transforms intervals among the wires; and a plurality of first post members that have a height greater than the thickness of the substrate, and are embedded in a portion of the substrate on which the interposer is stacked.

23 Claims, 21 Drawing Sheets

U.S. PATENT DOCUMENTS

| | | |
|---|---|---|
| 2009/0058440 A1 | 3/2009 | Miura et al. |
| 2010/0052707 A1* | 3/2010 | Nakayama et al. ............ 324/754 |
| 2010/0164518 A1* | 7/2010 | Yamada et al. ............... 324/754 |
| 2010/0219852 A1* | 9/2010 | Yamada et al. ............... 324/754 |

FOREIGN PATENT DOCUMENTS

| | | |
|---|---|---|
| JP | 3386077 | 5/1996 |
| JP | 10-019926 | 1/1998 |
| JP | 2004-077153 | 3/2004 |
| JP | 2004-117215 | 4/2004 |
| JP | 2005-164600 | 6/2005 |
| JP | 2005-164601 | 6/2005 |
| JP | 2007-003334 | 1/2007 |
| TW | 1284379 B | 7/2007 |
| WO | WO-03/087854 | 10/2003 |
| WO | WO2005/114228 | 12/2005 |
| WO | WO-2006/126279 | 11/2006 |
| WO | WO-2007/015314 | 2/2007 |

OTHER PUBLICATIONS

Office Action mailed May 31, 2011, issued for the corresponding Taiwanese Patent Application No. 95145094.

* cited by examiner

PROBE CARD

CROSS REFERENCE TO RELATED APPLICATIONS

This application is related to co-pending application entitled: "PROBE CARD" filed even date herewith in the names of Hiroshi NAKAYAMA, Mitsuhiro NAGAYA and Yoshio YAMADA as a national phase entry of PCT/JP2006/324183; which application is assigned to the assignee of the present application and is incorporated by reference herein.

TECHNICAL FIELD

The present invention relates to a probe card that electrically connects a semiconductor wafer as a test object and a circuit structure for generating a signal for a test.

BACKGROUND ART

In a semiconductor test process, a conductivity test is sometimes performed to detect a defective product by bringing probes having conductivity (conductive probes) into contact with a semiconductor wafer before dicing (WLT: Wafer Level Test). When this WLT is performed, to transfer a signal for a test generated and sent by a testing device (tester) to the semiconductor wafer, a probe card including a large number of probes is used. In the WLT, the probes are individually brought into contact with each of dies on the semiconductor wafer while the dies are scanned by the probe card. However, because several hundreds to several ten thousands dies are formed on the semiconductor wafer, it takes considerable time to test one semiconductor wafer. Thus, an increase in the number of dies causes higher cost.

To solve the problems of the WLT, recently, a method called FWLT (Full Waver Level Test) is also used in which several hundreds to several ten thousands probes are collectively brought into contact with all or at least a quarter to a half of dies on a semiconductor wafer. In this method, to accurately bring the probes into contact with the semiconductor wafer, there are known technologies for maintaining positional accuracy of tips of probes by accurately keeping the parallelism or the flatness of a probe card with respect to a predetermined reference surface and for highly accurately aligning a semiconductor wafer.

In testing a semiconductor wafer using a probe card, it is necessary to obtain stable contact resistance between probes of the probe card and electrode pads provided in the semiconductor wafer. Such contact resistance is related to a load exerted on the probes. It is known that the load exerted on the probes increases in proportion to a stroke of the probes. Therefore, to obtain stable contact resistance between the probes and the electrode pads in the test, it is important to accurately control the stroke of the probes within a predetermined range.

Patent Document 1: Japanese Patent Application Laid-Open No. 2005-164600
Patent Document 2: Japanese Patent Application Laid-Open No. 2005-164601
Patent Document 3: Japanese Patent No. 3386077

DISCLOSURE OF INVENTION

Problem to be Solved by the Invention

However, even if the stroke of the probes can be accurately controlled, if accuracy errors of the parallelism and the flatness of the probe card with respect to a predetermined reference surface are larger than a controllable range of the stroke of the probes in the test, there is a problem in that all the probes cannot be collectively brought into contact with the semiconductor wafer.

A probe card applied to an FWLT has a large size of a substrate having a wiring pattern on a surface thereof. Therefore, deformation such as warp and waviness tends to occur in the substrate. This is a factor of deterioration in accuracies of the flatness and the parallelism of the entire probe card. Moreover, because fluctuation in the thickness of a solder resist (an insulating film) formed on the wiring pattern on the surface of the substrate is large, irregularity may occur on the substrate. In addition, when the probe card is applied to a WLT, it is likely that the same problem occurs in a test of a semiconductor wafer having the number of pins per one die exceeding one thousand.

As described above, it is difficult to highly accurately keep the flatness and the parallelism of the substrate compared with other members configuring the probe card. Therefore, there is a demand for a technology that can improve the accuracies of the flatness and the parallelism of the probe card without being affected by such deformation of the substrate.

The present invention has been achieved in view of the above problems, and it is an object of the invention to provide a probe card that can improve the accuracies of the flatness and the parallelism thereof regardless of presence or absence of deformation of a substrate having a wiring pattern.

Means for Solving Problem

According to an aspect of the present invention, a probe card electrically connects a semiconductor wafer as a test object and a circuit structure for generating a signal for a test. The probe card includes a plurality of probes that are made of a conductive material and come into contact with the semiconductor wafer to receive or output an electric signal; a probe head that houses and holds the probes; a substrate that is flat and has a wiring pattern corresponding to the circuit structure; a reinforcing member that is mounted on the substrate and reinforces the substrate; an interposer that is stacked on the substrate for connection of wires of the substrate; a space transformer that is interposed and stacked between the interposer and the probe head and transforms intervals among the wires to be connected through the interposer, the wires coming out on a surface of the space transformer facing the probe head; and a plurality of first post members that have a height greater than a thickness of the substrate, and are embedded in the substrate from a portion of the substrate on which the interposer is stacked to penetrate through the substrate.

The probe card may further include a first fastening member for fastening the interposer to the substrate.

In the probe card, the first fastening member may include at least one first screw member inserted through at least one of the reinforcing member and the interposer.

In the probe card, the first post members may each include a first hollow portion passing through the first post member in a height direction of the first post member, an inner surface of the first hollow portion being threaded. First screw members may be screwed into the first hollow portion from openings on both sides of the first hollow portion, respectively.

In the probe card, the first post members may each include a first hollow portion passing through the first post member in a height direction of the first post member. The first screw member is inserted through the first hollow portion from one side of the first hollow portion.

The probe card may further include a holding member that is fixed to the substrate and presses and holds the interposer and the space transformer; and a leaf spring that is fixed to the holding member and presses an edge portion of a surface of the probe head over entire circumference in a direction of the substrate. The probes project from the surface of the probe head.

In the probe card, the interposer may include a plurality of connection terminals that are made of a conductive material and resilient in an axial direction of the connection terminals; and a housing that is made of an insulating material and includes a plurality of hole portions each housing one of the connection terminals.

In the probe card, the connection terminals may each include a first needle-like member and a second needle-like member each having a tapered tip; and a spring member that is in a coil shape and resiliently connects the first needle-like member to the second needle-like member such that axial directions of the first needle-like member and the second needle-like member match.

In the probe card, the spring member may include a tightly wound portion that is bendable in each of the hole portions and, when bent, comes into contact with any one of the first needle-like member and the second needle-like member.

In the probe card, the connection terminals may be in a coil shape, and each may include a pair of electrode pin portions in each of which a coil is tightly wound to be tapered toward either end in the axial direction; and a coil spring portion that connects between the electrode pin portions.

In the probe card, the coil spring portion may include a tightly wound portion that is arranged in a middle, in the axial direction, of each of the connection terminals; a constantly wound portion that is arranged on a side of the tightly wound portion; and a loosely wound portion that is arranged on a side of the tightly wound portion other than where the constantly wound portion is arranged, in which a coil is wound more loosely than in the constantly wound portion.

The probe card may further include a second fastening member for fastening the space transformer to the substrate.

In the probe card, the second fastening member may include at least one second screw member inserted through at least one of the reinforcing member and the space transformer.

In the probe card, the second screw member penetrates through the space transformer passing through a center of gravity of the space transformer.

The probe card may further include second post members equal in number to second screw members. The second post members may have a height equal to the height of the first post members, and are embedded in the substrate from a portion of the substrate on which the interposer is stacked to penetrate through the substrate, each including a second hollow portion passing through the second post member in a height direction of the second post member, an inner surface of the second hollow portion being threaded. The second screw members are screwed into the second hollow portion from openings on both sides of the second hollow portion, respectively.

The probe card may further include second post members equal in number to second screw members. The second post members have a height equal to the height of the first post members, and are embedded in the substrate from a portion of the substrate on which the interposer is stacked to penetrate through the substrate, each including a second hollow portion passing through the second post member in a height direction of the second post member. The second screw member is inserted through the second hollow portion from one side of the second hollow portion.

In the probe card, the second screw member may include a bolt one end of which is brazed to a surface of the space transformer; and a nut that is screwed onto another end of the bolt.

The probe card may further include second post members equal in number to second screw members. The second post members have a height equal to the height of the first post members, and are embedded in the substrate from a portion of the substrate on which the interposer is stacked to penetrate through the substrate, each including a second hollow portion passing through the second post member in a height direction of the second post member. The bolt is inserted through the second hollow portion from one side of the second hollow portion.

In the probe card, the interposer may include a plurality of connection terminals that are made of a conductive material and resilient in an axial direction of the connection terminals; and a housing that is made of an insulating material and includes a plurality of hole portions each housing one of the connection terminals.

In the probe card, the connection terminals may each include a first needle-like member and a second needle-like member each having a tapered tip; and a spring member that is in a coil shape and resiliently connects the first needle-like member to the second needle-like member such that axial directions of the first needle-like member and the second needle-like member match.

In the probe card, the spring member may include a tightly wound portion that is bendable in each of the hole portions and, when bent, comes into contact with any one of the first needle-like member and the second needle-like member.

In the probe card, the connection terminals may be in a coil shape, and each include a pair of electrode pin portions in each of which a coil is tightly wound to be tapered toward either end in the axial direction; and a coil spring portion that connects between the electrode pin portions.

In the probe card, the coil spring portion may include a tightly wound portion that is arranged in a middle, in the axial direction, of each of the connection terminals; a constantly wound portion that is arranged on a side of the tightly wound portion; and a loosely wound portion that is arranged on a side of the tightly wound portion other than where the constantly wound portion is arranged, in which a coil is wound more loosely than in the constantly wound portion.

Effect of the Invention

According to an aspect of the present invention, it is possible to improve the accuracy of the flatness and parallelism of the probe card regardless of whether the substrate having the wiring pattern has been deformed.

Figure 1:
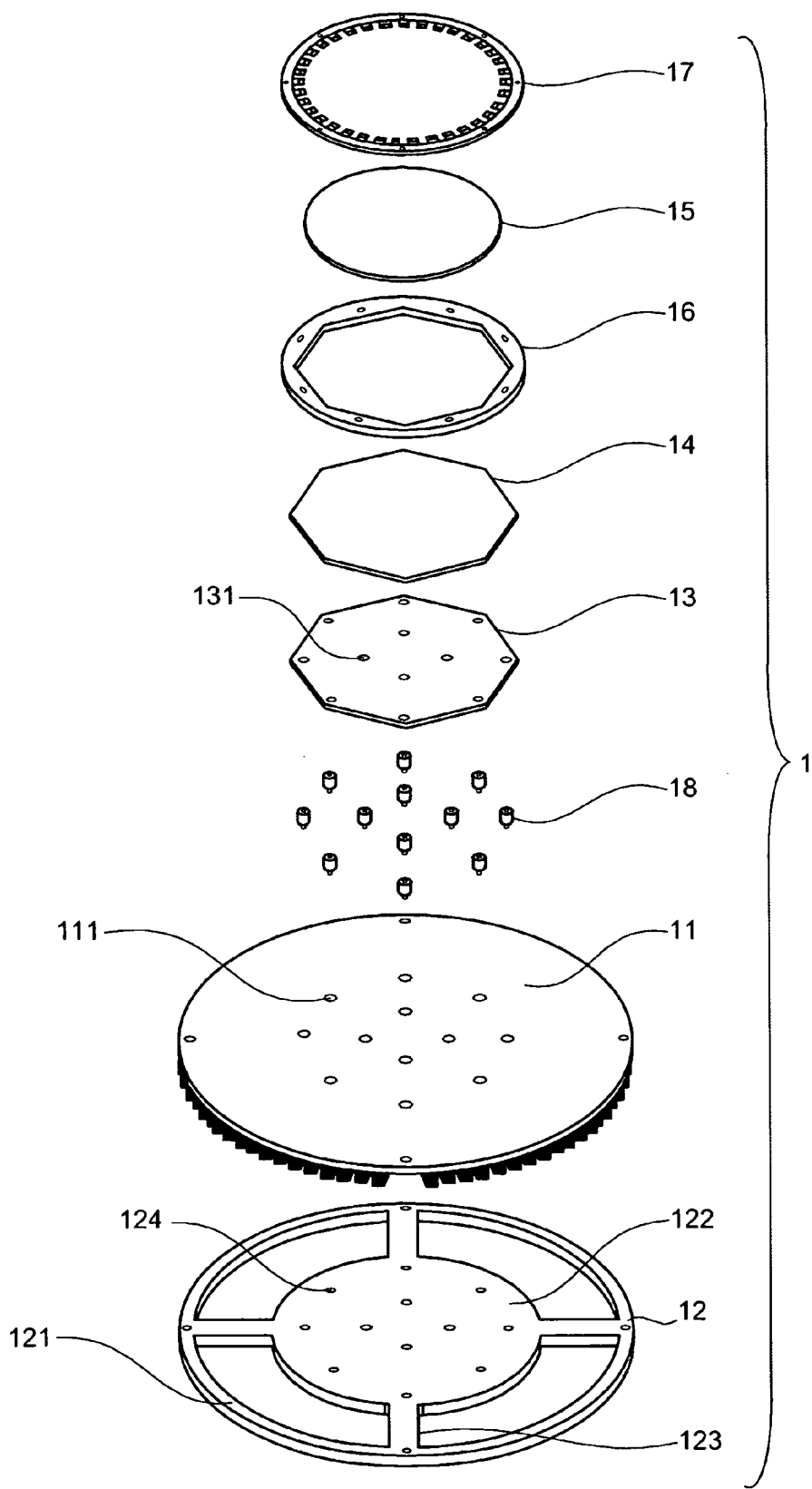
FIG. 1 is a exploded perspective view of the structure of relevant part of a probe card according to a first embodiment of the present invention.

EXPLANATIONS OF LETTERS OR NUMERALS 1, 5, 6, 7, 8, 9, 10, 401 probe card
2 probe
3 connector seat
4 semiconductor wafer
11, 71, 81, 89, 402 substrate
12, 52, 72, 82, 92, 102 reinforcing member
13, 63, 83, 103, 430 interposer
14, 84, 90, 104 space transformer
15, 85, 403 probe head
15p, 403p probe housing area
16, 86 holding member
17, 87, 404 leaf spring
18, 58, 78, 88, 98 post member
18a, 78a, 88a, 98a large diameter portion
18b, 78b, 88b, 98b small diameter portion
19 wire
20 male connector
21, 22, 833, 834 needle-like member
21a, 22a, 833a, 834a needle-like portion
21b, 22c, 833c, 834c boss portion
21c shaft portion
22b, 833b, 834b flange portion
23, 835 spring member
23a, 432f, 835b loosely wound portion
23b, 432e, 835a tightly wound portion
30 female connector
40 wafer chuck
41, 112, 141, 812, 841 electrode pad
111, 124, 131, 151, 433, 524, 631, 711, 712, 724, 811, 812, 824, 825, 830, 836, 837, 838, 842, 924, 925, 1024, 1025, 1031 hole portion
121, 521, 721, 821, 921, 1021 outer peripheral portion
122, 522, 722, 822, 922, 1022 central portion
123, 523, 723, 823, 923, 1023 coupling portion
124a, 131a, 151a, 433a, 824a, 825a, 830a, 836a, 837a, 842a, 1025b, 1031b small diameter hole
124b, 131b, 151b, 433b, 824b, 825b, 830b, 836b, 837b, 842b, 1025a, 1031a large diameter hole
124c, 824c, 825c medium diameter hole
171, 414 pawl portion
181, 581, 881, 981 hollow portion
201, 202, 203, 204, 301, 302, 303, 304, 305 screw
306 bolt
306a end
307 nut
431, 831 housing
432, 832 connection terminal
432a coil spring portion
432b, 432c electrode pin portion
432d constantly wound portion
725 groove portion
831a first member
831b second member
1041 pad
W wax

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like are different from realistic ones. It goes without saying that, the drawings depict some portion as having different relations and ratios of dimensions.

First Embodiment

Figure 2:
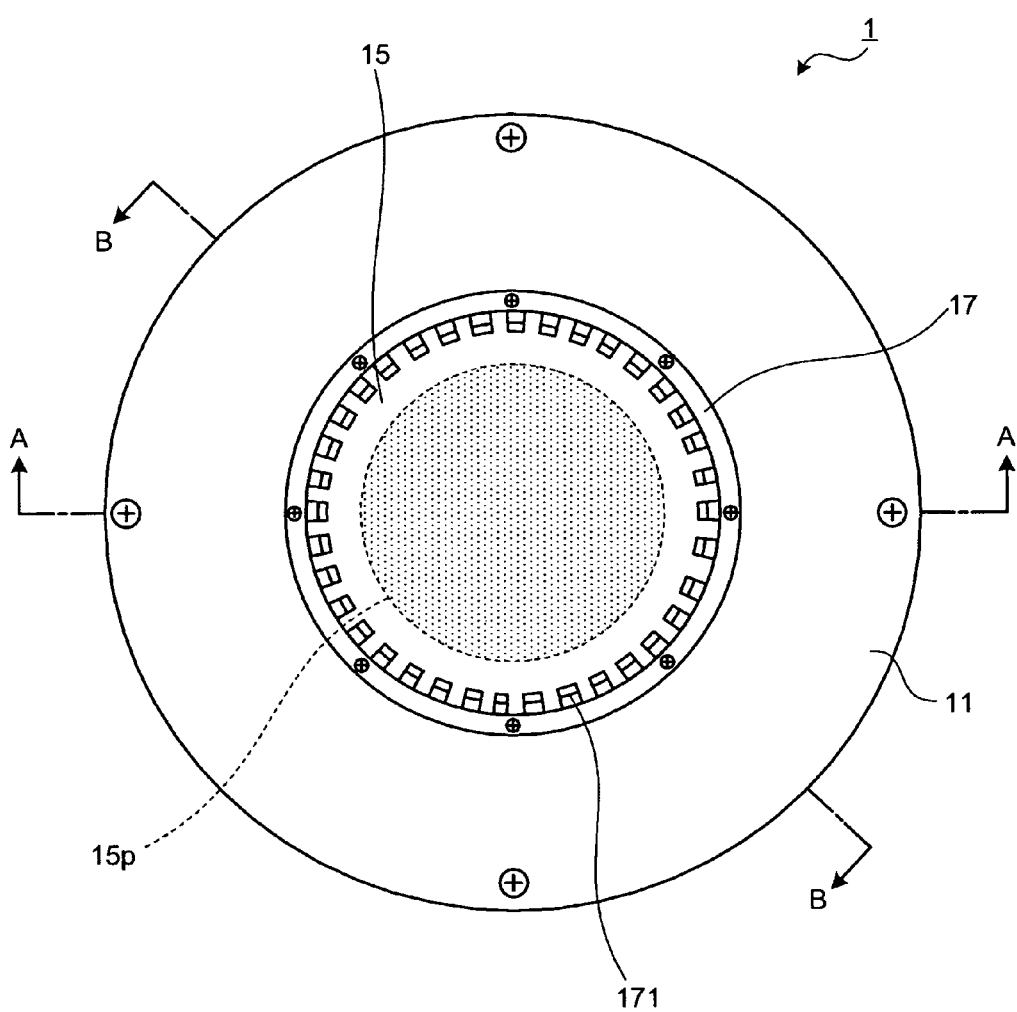
FIG. 2 is a top view of the structure of the probe card according to the first embodiment of the present invention.
Figure 3:
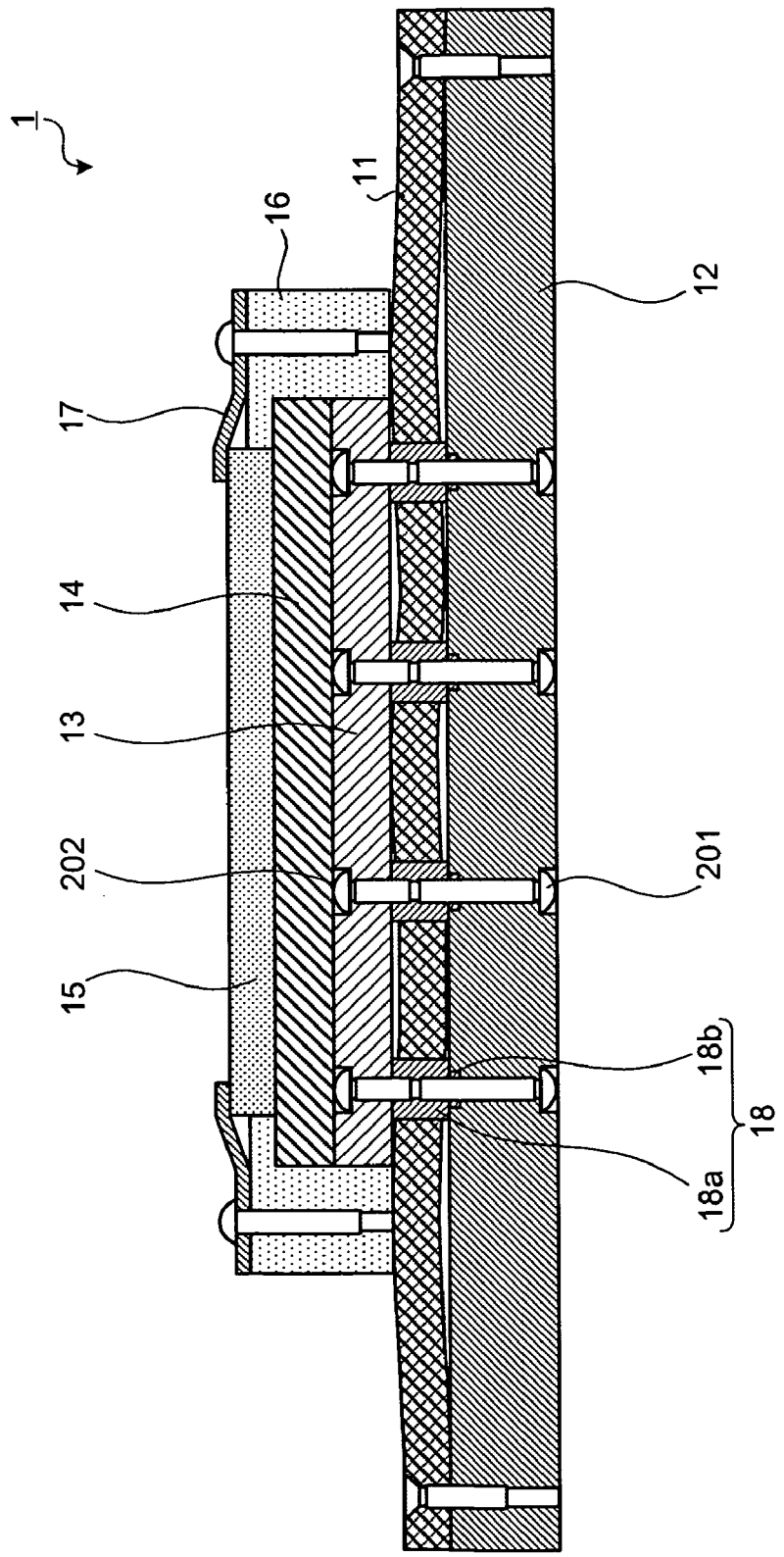
FIG. 3 is a sectional view taken along line A-A in FIG. 2.
Figure 4:
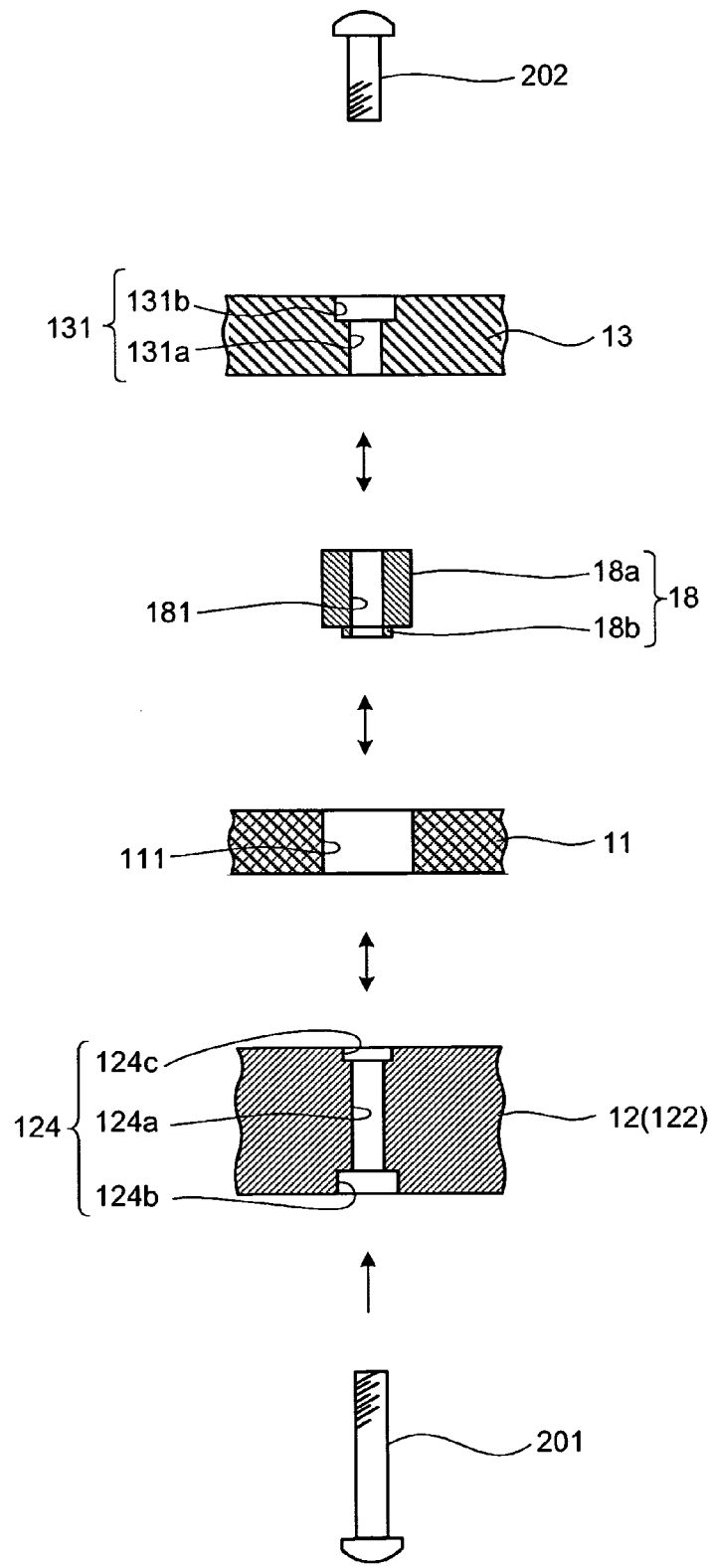
FIG. 4 is a diagram of an overview of assembly of relevant part of the probe card according to a first embodiment of the present invention.

FIG. 1 is a exploded perspective view of the structure of relevant part of a probe card according to a first embodiment of the present invention. FIG. 2 is a top view of the probe card according to the first embodiment. FIG. 3 is a sectional view taken along line A-A in FIG. 2. FIG. 4 is a diagram of an overview of assembly of relevant part of the probe card according to the first embodiment. The probe card 1 shown in FIGS. 1 to 4 electrically connects, using a plurality of probes, a semiconductor wafer as a test object and a testing device including a circuit structure for generating a signal for a test.

The probe card 1 includes a substrate 11 that is formed in a thin disc shape and realizes electrical connection with the testing device, a reinforcing member 12 that is mounted on one side of the substrate 11 and reinforces the substrate 11, an interposer 13 for connection of wires from the substrate 11, a space transformer 14 that transforms intervals among the wires connected through the interposer 13, and a probe head 15 that is formed in a disc shape having a diameter smaller than that of the substrate 11 and stacked on the space transformer 14 and houses and holds a plurality of probes corresponding to a semiconductor wafer as the test object. The probe card 1 also includes a holding member 16 that is fixed to the substrate 11 and collectively holds the interposer 13 and the space transformer 14 in a stacked state, a leaf spring 17 that is fixed to the holding member 16 and fixes an end of the probe head 15, and a plurality of post members 18 (first post members) embedded in predetermined places of the substrate 11.

The more detailed structure of the probe card 1 is explained below. The substrate 11 is formed by using an insulating material such as Bakelite or epoxy resin. In the substrate 11, a wiring layer (wiring pattern) for electrically connecting the probes and the testing device is three-dimensionally formed by via-holes and the like. Hole portions 111, through which the post members 18 are inserted, are provided in the substrate 11 in the same number as the post members 18. In FIG. 3, a state in which the substrate 11, which is originally flat, deforms and a longitudinal section of the substrate 11 is wavy is shown.

The reinforcing member 12 includes a circular outer peripheral portion 121 that has substantially the same diameter as the substrate 11, a central portion 122 that has the center the same as that of a circle formed by the outer peripheral portion 121 and is formed in a disc shape having a surface area slightly larger than an area of the surface of the interposer 13, and a plurality of coupling portions 123 (four in FIG. 1) that extend from an outer peripheral direction of the central portion 122 to reach the outer peripheral portion 121 and couple the outer peripheral portion 121 and the central portion 122. A plurality of hole portions 124, through which screws 201 are inserted, are formed in the central portion 122 of the reinforcing member 12. The hole portions 124 have small diameter holes 124a having the same diameter as screw portions of the screws 201, large diameter holes 124b having a diameter that can house screw heads of the screws 201, and medium diameter holes 124c in which the post members 18 are placed. Such a reinforcing member 12 is realized by a material of high hardness such as alumite-finished aluminum, stainless steel, an invar material, a Kovar material (registered trademark), or duralumin.

The interposer 13 has a regular octagonal surface and is formed in a thin plate shape. A plurality of hole portions 131, through which screws 202 are inserted, are formed in the interposer 13. The hole portions 131 have small diameter holes 131a having the same diameter as screw portions of the screws 202 and large diameter holes 131b having a diameter that can house screw heads of the screws 202. An interposer having a base material of a think film shape made of an insulating material such as ceramic and a plurality of leaf-spring connection terminals disposed in a predetermined pattern on both sides of the base material and formed in a cantilever shape can be applied as the interposer 13. In this case, connection terminals provided on one surface of the interposer 13 come into contact with electrode pads of the space transformer 14 and connection terminals provided on the other surface come into contact with electrode pads of the substrate 11, whereby electrical connection is established between the space transformer 14 and the substrate 11.

Pressure conductive rubber (rubber connector) in which metal particles are arranged in the thickness direction in thin-walled silicone rubber can also be applied as the interposer 13 besides the one described above. When a pressure is applied in the thickness direction, the metal particles adjacent to one another in the silicone rubber come into contact with one another, whereby the pressure conductive rubber exhibits anisotropic conductivity. The electrical connection between the substrate 11 and the space transformer 14 can be applied by configuring the interposer 13 using the pressure conductive rubber having such a characteristic.

As with the substrate 11, a wiring layer on the inside of the space transformer 14 is three-dimensionally formed by via holes and the like. The space transformer 14 has a regular octagonal surface substantially congruent with the interposer 13 and is formed in a thin plate shape. Such a space transformer 14 includes an insulating material such as ceramic as a base material and also plays a function of reducing a difference between the coefficient of thermal expansion of the semiconductor wafer and the coefficient of thermal expansion of the substrate 11.

The probe head 15 is formed in a disc shape and houses and holds the probes in a probe housing area 15p shown in FIG. 2 such that the probes project vertically on the paper surface in FIG. 2. An array pattern of the probes is decided according to a wiring pattern of the semiconductor wafer as a test object. The more detailed structure of the probe head 15 and the structure of the probes housed in the probe head 15 are described later.

The holding member 16 is made of the same material as that of the reinforcing member 12 and has a hollow portion of a regular octagonal pole shape in which the interposer 13 and the space transformer 14 can be stacked and held. The holding member 16 presses and holds the interposer 13 and the space transformer 14 against the substrate 11 to thereby apply a pressure necessary for the substrate 11 and the space transformer 14 to be electrically connected via the interposer 13.

The leaf spring 17 is formed of a resilient material such as phosphor bronze, stainless steel (SUS), or beryllium copper and is formed in a thin annular shape. In an inner circumference of the leaf spring 17, pawl portions 171 as pressing members for holding the interposer 13, the space transformer 14, and the probe head 15 are uniformly provided over the entire circumference. Such pawl portions 171 equally press the entire circumference near an edge of the surface of the probe head 15 in a direction of the substrate 11. Therefore, a substantially uniform initial load is generated in the probes housed in the probe head 15 and warp of the probe head 15 can be prevented. In the first embodiment, the respective surfaces of the interposer 13 and the space transformer 14 are formed in a regular octagonal shape having an area substantially the same as a circle formed by the surface of the probe head 15. Therefore, the pawl portions 171 can press vertex positions of the regular octagonal shape and also plays a function of preventing warp of the interposer 13 and the space transformer 14.

The post members 18 have large diameter portions 18a of a hollow cylindrical shape having thickness slightly larger than the thickness of the substrate 11 and small diameter portions 18b of a hollow cylindrical shape having a diameter smaller than that of the large diameter portions 18a and center axes the same as those of the large diameter portions 18a. The post members 18 also have hollow portions 181 (first hollow portions) passing through along a center axis direction (a height direction) thereof. The hollow portions 181 have the same diameter as the small diameter holes 124a of the hole portions 124 and the small diameter holes 131a of the hole portions 131. Screw threads, with which the screws 201 and 202 can be screwed, are provided on inner surfaces thereof (not shown). Such post members 18 can be made of the same material as that of the reinforcing member 12. However, in view of the demand for high machining accuracy, in particular, stainless steel is suitable.

As shown in FIGS. 3 and 4, the reinforcing member 12 and the interposer 13 are fastened by screwing a pair of screws 201 and 202 from openings on both sides of the hollow portions 181 of the post members 18, respectively. In this sense, the pair of screws 201 and 202 screwed into the hollow portions 181 of the same post members 18 are first screw members configuring a first fastening member. The substrate 11 and the reinforcing member 12, the substrate 11 and the holding member 16, and the holding member 16 and the leaf spring 17 are fastened by screws screwed into predetermined positions (not shown in FIG. 1).

When the reinforcing member 12 and the interposer 13 are fastened via the substrate 11, first, positioning of the substrate 11 and the reinforcing member 12 is performed and the post members 18 are embedded in the hole portions 111. Thereafter, the screws 201 are inserted from the hole portions 124 and screwed into the post members 18 to fasten the post members 18 to the reinforcing member 12. Subsequently, the interposer 13 is arranged in a predetermined position on a surface on the opposite side of the surface on which the reinforcing member 12 is mounted of the surface of the substrate 11. The screws 202 are inserted from the hole portions 131 of the interposer 13 and screwed into the post members 18 to fasten the post members 18 to the interposer 13. According to the process described above, the reinforcing member 12 and the interposer 13 are fastened via the post members 18 embedded in the substrate 11.

Figure 5:
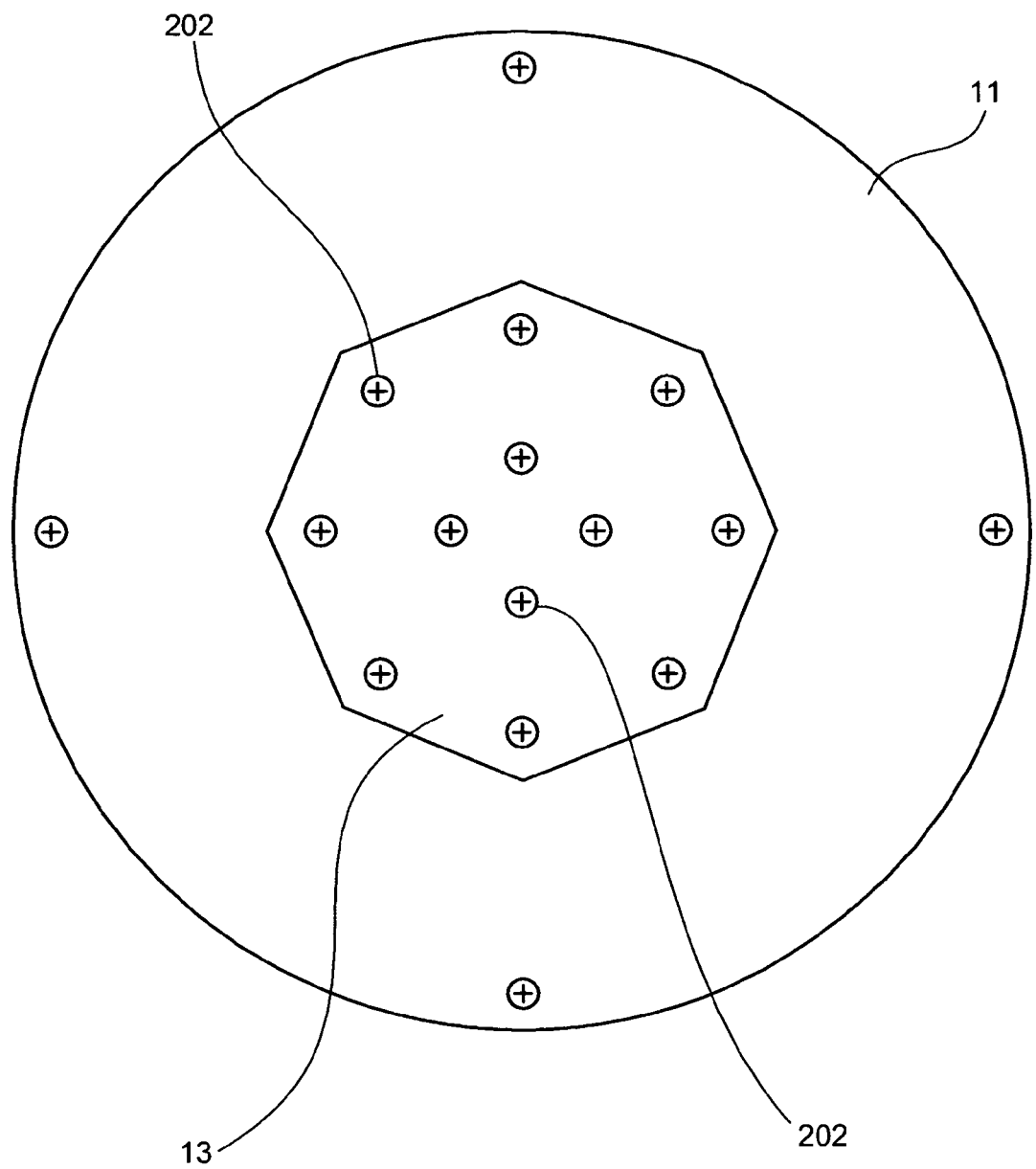
FIG. 5 is a top view of assembled relevant part of the probe card according to the first embodiment of the present invention.

FIG. 5 is a diagram of a state of the interposer 13 fixed to the reinforcing member 12 via the substrate 11 viewed from the interposer 13 side. FIG. 5 is equivalent to a top view excluding the components (including the holding member 16) above the interposer 13 in FIG. 3. As shown in FIG. 5, in view of the fact that the surface of the interposer 13 is formed in a regular octagonal shape, the post members 18 are arranged near the respective vertexes of the regular octagon and near the center of the regular octagon. As a result, FIG. 5 has 90 degrees rotational symmetry with respect to an axis that passes through the center of the regular octagon formed by the surface of the interposer 13 and is perpendicular to the paper surface. It goes without saying that this arrangement is only an example.

By fastening the interposer 13 and the reinforcing member 12 via the post members 18 in this way, the width in a thickness direction of a substrate portion can be defined by the height of the post members 18 rather than the thickness of the substrate 11. Therefore, even if deformation such as warp, waviness, or irregularity occurs in the flat substrate 11 (see FIG. 3), the probe card 1 is not affected by the deformation. It is possible to improve accuracy of the parallelism and flatness of the probe head 15 with respect to an attachment reference surface in attaching the probe card 1 to a prober (a device that brings the probes and the semiconductor wafer into contact with each other) (usually, the probe card 1 is attached to the prober with a bottom surface in FIG. 3 of the reinforcing member 12 fit to the prober).

When the reinforcing member 12 is mounted on the substrate 11, the screws 201 are screwed into the post members 18 to fasten the reinforcing member 12 to the post members 18. Consequently, even when the interposer 13 is arranged further on a lower side than the substrate 11 and the substrate 11 is lowered to be attached to the interposer 13, the post members 18 do not separate from the substrate 11 and fall. Therefore, it is possible to improve-workability in assembling the probe card 1.

After the interposer 13 is fixed to the reinforcing member 12, the space transformer 14 is fixed to the interposer 13 and the holding member 16 is fixed to the substrate 11, whereby a predetermined pressure is applied to the space transformer 14. Thereafter, positioning of the probe head 15 in which the probes are housed is performed and the leaf spring 17 is fixed to the holding member 16, whereby the probe card 1 is completed.

Figure 6:
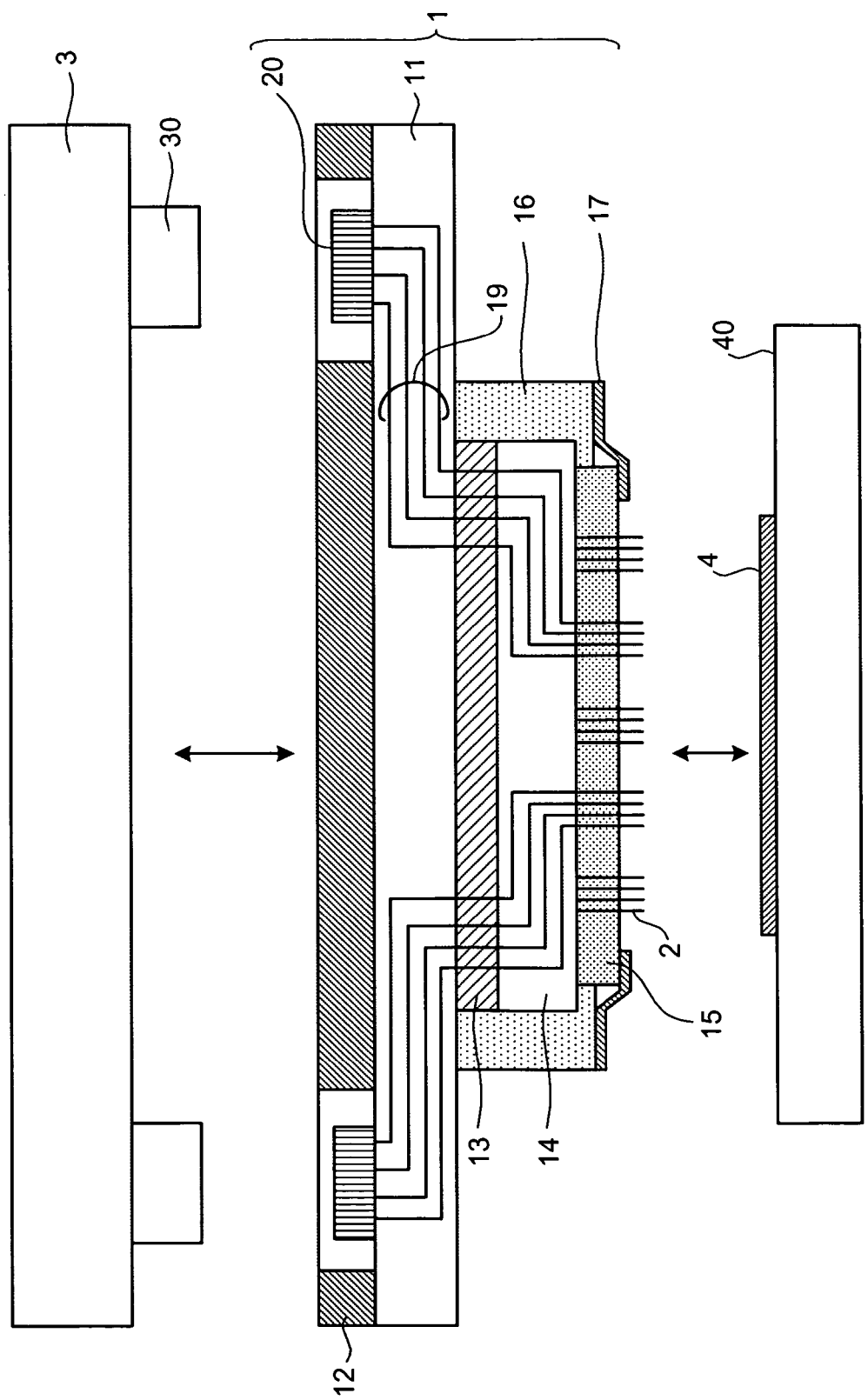
FIG. 6 is a diagram of an overview of a test performed by using the probe card according to the first embodiment of the present invention.
Figure 7:
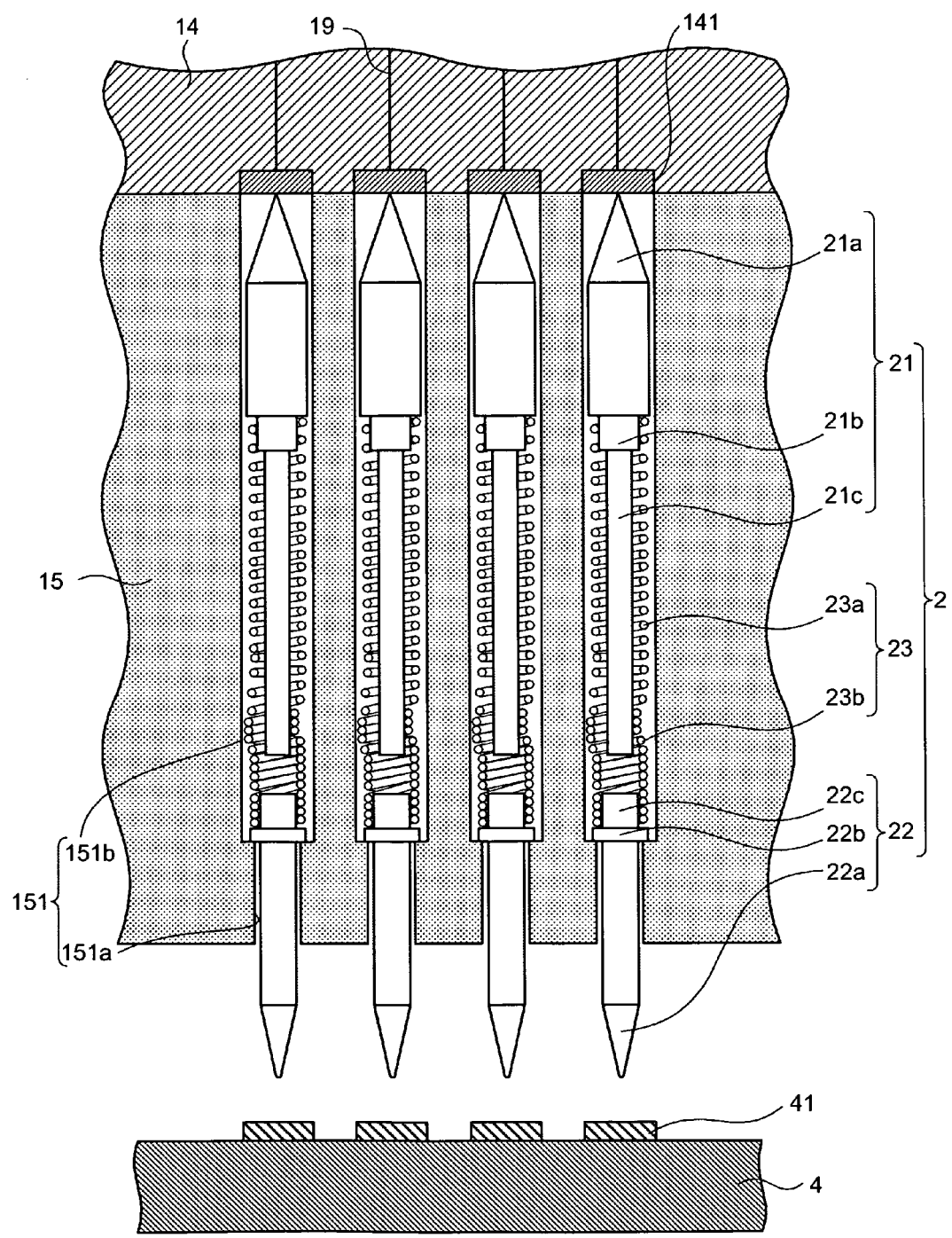
FIG. 7 is an enlarged partial sectional view of the structure of probes and relevant part of a probe head.

FIG. 6 is a diagram of an overview of a test performed by using the probe card 1. Concerning the probe card 1, a sectional view (a cross section taken along line B-B in FIG. 2) different from FIG. 3 is more schematically shown than that in FIG. 3. FIG. 7 is an enlarged partial sectional view of the structure of relevant part of the probe head 15 and the detailed structure of the probes housed in the probe head 15. In FIGS. 6 and 7, to show the probe card 1 in a vertical position the same as that in an actual test, the vertical position is reversed from that shown in FIG. 3.

One ends of wires 19 formed in the substrate 11 are connected to a plurality of male connectors 20 disposed on a surface of the substrate 11, which is a surface on a side where the reinforcing member 12 is mounted, to be connected to a testing device (not shown). On the other hand, the other ends of the wires 19 are connected to the probes 2, which are housed and held in the probe head 15, via electrode pads 141 formed at a lower end of the space transformer 14. In FIG. 6, for simplification of illustration, only a part of the wires 19 are shown.

The respective male connectors 20 are disposed radially with respect to the center of the substrate 11 and form pairs with respective female connectors 30 provided in positions opposed thereto in a connector seat 3 of the testing device. Terminals of the probes 2 and the testing device come into contact with each other to thereby establish electrical connection between the probes 2 and the testing device. As a connector including the male connectors 19 and the female connectors 30, it is possible to apply a zero insertion force (ZIF) type connector that requires little external force when male connectors are inserted and pulled and applies a press contact force to the connectors using an external force after the connectors are coupled. If the ZIF type connector is applied, the probe card 1 and the testing device are hardly subjected to stress due to connection even if the number of the probes 2 is large, sure electrical connection can be obtained, and durability of the probe card 1 can be improved.

Female connectors can be disposed in the substrate 11 and, on the other hand, male connectors can be disposed in the connector seat 3. It goes without saying that a shape of the male connectors and arrangement positions on the substrate of the male connectors are not limited to those described above and a shape and arrangement positions of the female connectors provided on the testing device side are also changed according to the shape and the arrangement positions of the male connectors.

Instead of realizing the connection between the probe card and the testing device using the connectors, it is also possible that terminals such as pogo pins having a spring action are provided in the testing device and the probe card is connected to the testing device via such terminals.

The structure of the probes 2 housed in the probe head 15 is explained. The probes 2 are disposed such that the tips on one side project according to an arrangement pattern of electrode pads 41 of the semiconductor wafer 4 placed on a wafer chuck 40. The tips (bottom surface sides) of the respective probes 2 come into contact with surfaces of a plurality of electrode pads 41 of the semiconductor wafer 4 from a vertical direction.

More specifically, the probes 2 include needle-like members 21 that are in contact with the space transformer 14, needle-like members 22 that project in a direction opposed to the needle-like members 21 and come into contact with the electrode pads 41 of the semiconductor wafer 4, and spring members 23 that are provided between the needle-like members 21 and the needle-like members 22 and resiliently couple the two kinds of needle-like members 21 and 22. The needle-like members 21 and 22 coupled to each other and the spring members 23 have identical axes.

The needle-like members 21 include needle-like portions 21a that have sharp tips projecting in a tip direction, boss portions 21b that are provided in base end portions on the opposite side of the sharp tips of the needle-like portions 21a and have a diameter smaller than a diameter of the needle-like portions 21a, and shaft portions 21c that extend out from surfaces on the opposite side of sides of the boss portions 21b in contact with the needle-like portions 21a. The needle-like members 21 are formed in a shape axially symmetrical in a longitudinal direction thereof. On the other hand, the needle-like members 22 include needle-like portions 22a that have sharp tips projecting in a tip direction, flange portions 22b that are provided in base end portions on the opposite side of the sharp tips of the needle-like portions 22a and have a diameter larger than a diameter of the needle-like portions 22a, and boss portions 22c that project from surfaces on the opposite side of sides of the flange portions 22b in contact with the needle-like portions 22a and have a diameter smaller than the diameter of the flange portions 22b. The needle-like members 22 are formed in a shape axially symmetrical in a longitudinal direction thereof.

The needle-like members 21 sides of the spring members 23 are loosely wound portions 23a and, on the other hand, the needle-like members 22 sides thereof are tightly wound portions 23b. Ends of the loosely wound portions 23a are wound around the boss portions 21b of the needle-like members 21. Ends of the tightly wound portions 23b are wound around the boss portions 22c of the needle-like members 22. The loosely wound portions 23a and the boss portions 21b are joined and the tightly wound portions 23b and the boss portions 22b are joined by any one of a spring winding force and soldering or both.

In the probes 2 having the structure described above, because the spring members 23 are provided, the needle-like members 21 and 22 are resiliently movable in the up and down directions in FIG. 7. At least a part of the tightly wound portions 23b are in contact with the shaft portions 21c of the needle-like members 21 in a state in which the needle-like members 21 are in contact with the electrode pads 141, i.e., a state shown in FIG. 7. In other words, the length in an axial direction of the tightly wound portions 23b is set to length with which the state shown in FIG. 7 can be realized. An inner diameter of the spring members 23 is slightly larger than an outer diameter of the boss portions 21b and the boss portions 22c. Consequently, it is possible to achieve improved resiliency of the spring members 23.

Although not shown in FIGS. 6 and 7, the probes 2 housed and held in the probe head 15 include a probe for a ground and a probe or electric power supply. Therefore, some of the wires 19 connected to the probes 2 are connected to a ground layer and a power supply layer.

The probe head 15 is formed by using an insulating material such as ceramic. Hole portions 151 for housing the probes 2 pass through the probe head 15 in a thickness direction (a vertical direction in FIG. 7) according to an array of the semiconductor wafer 4. The hole portions 151 include small diameter holes 151a formed from a lower part in FIGS. 6 and 7, i.e., a facet on the semiconductor wafer 4 side over at least predetermined length smaller than the length in a longitudinal direction of the needle-like portions 22a and large diameter holes 151b that have center axes the same as those of the small diameter holes 151a and have a diameter larger than that of the small diameter holes 151a. As shown in FIG. 7, an inner diameter of the small diameter holes 151a is slightly larger than an outer diameter of the needle-like portions 22a of the needle-like members 22 and slightly smaller than an outer diameter of the flange portions 22b. The hole portions 151 are formed in a stepped hole shape in this way, whereby (the needle-like members 22 of) the probes 2 are prevented from coming off.

When the electrode pads 41 of the semiconductor wafer 4 are brought into contact with tip portions of the needle-like portions 22a by lifting the wafer chuck 40 from the state shown in FIG. 7, the needle-like members 22 rise and the spring members 23 are compressed and curve to meander. In this case, because part of the inner periphery of the tightly wound portions 23b maintain a-state of contact with the shaft portions 21c of the needle-like members 21, a linear electric signal along the axial direction of the probe 2 flows to the tightly wound portion 23b. Therefore, an electric signal does not flow in a coil shape to the loosely wound portion 23a and an increase in the inductance of the probes 2 can be controlled.

The probe head 15 can be divided into two, i.e., upper and lower portions, along the vertical direction in FIG. 7. In this case, the two portions are fastened by using screws and positioning pins. To prevent a plate on a lower side from being expanded by an initial load of the probes 2, the thickness of the portion on the lower side is set larger than the thickness of the portion on the upper side. By dividing the probe head 15 in this way, it is possible to easily replace the probes 2.

The number and an arrangement pattern of the probes 2 housed in the probe head 15 are decided according to the number of semiconductor chips formed in the semiconductor wafer 4 and an arrangement pattern of the electrode pads 41. For example, when the semiconductor wafer 4 having a diameter of 8 inches (about 200 millimeters) is a test object, several hundreds to several thousands probes 2 are necessary. When the semiconductor wafer 4 having a diameter of 12 inches (about 300 millimeters) is a test object, several thousands to several ten thousands probes 2 are necessary. When the large number of probes 2 are held in this way, deformation such as warp, waviness, and irregularity of the probe head 15 is a problem. However, in the first embodiment, pawl portions 171 of the leaf spring 17 uniformly press the entire circumference near an edge of the probe head 15 having a circular surface. Therefore, irregular warp and waviness do not occur in the probe head 15, the probe head 15 is excellent in durability, and a stable probe stroke can be obtained.

With the probe card according to the first embodiment of the present invention explained above, the probe card includes a plurality of probes that are made of a conductive material and come into contact with the semiconductor wafer to input or output an electric signal, a probe head that houses and holds the probes, a flat substrate that has a wiring pattern corresponding to a circuit structure for generating a signal for a test, a reinforcing member that is mounted on the substrate and reinforces the substrate, an interposer that is stacked on the substrate for connection of wires of the substrate, a space transformer that is interposed and stacked between the interposer and the probe head, transforms intervals among the wires to be connected through the interposer, and leads out the wires to a surface on a side opposed to the probe head, a plurality of first post members that are embedded piercing through the substrate from the surface of a portion on which the interposer is stacked, and have height larger than the thickness of the substrate, and a first fastening member for fastening the substrate and the interposer. Consequently, it is possible to improve accuracy of the flatness and parallelism regardless of whether the substrate having the wiring pattern has been deformed.

With the probe card according to the first embodiment, accuracy of tip-positions of the probes is also improved according to the improvement of the accuracy of the flatness and parallelism. Therefore, it is possible to control fluctuation in positions in a height direction of the tips among the probes, substantially fix strokes of all the probes, and obtain stable contact resistance. In addition, because the strokes of all the probes are substantially fixed, an unnecessarily large load is not applied to a specific probe. Therefore, the electrode pads are prevented from being excessively damaged. It is possible to prevent, for example, deterioration in yield in a process of connecting dies and packages (wire bonding, etc.) and breakage of the wires connected to the electrode pads.

Further, with the probe card according to the first embodiment, the leaf spring uniformly presses the entire circumference near an edge of the probe head surface in a direction of the substrate. Therefore, it is possible to control warp of the interposer, the space transformer, and the probe head besides the substrate and improve accuracy of the flatness and parallelism of the entire probe card.

Modifications of the First Embodiment

Figure 8:
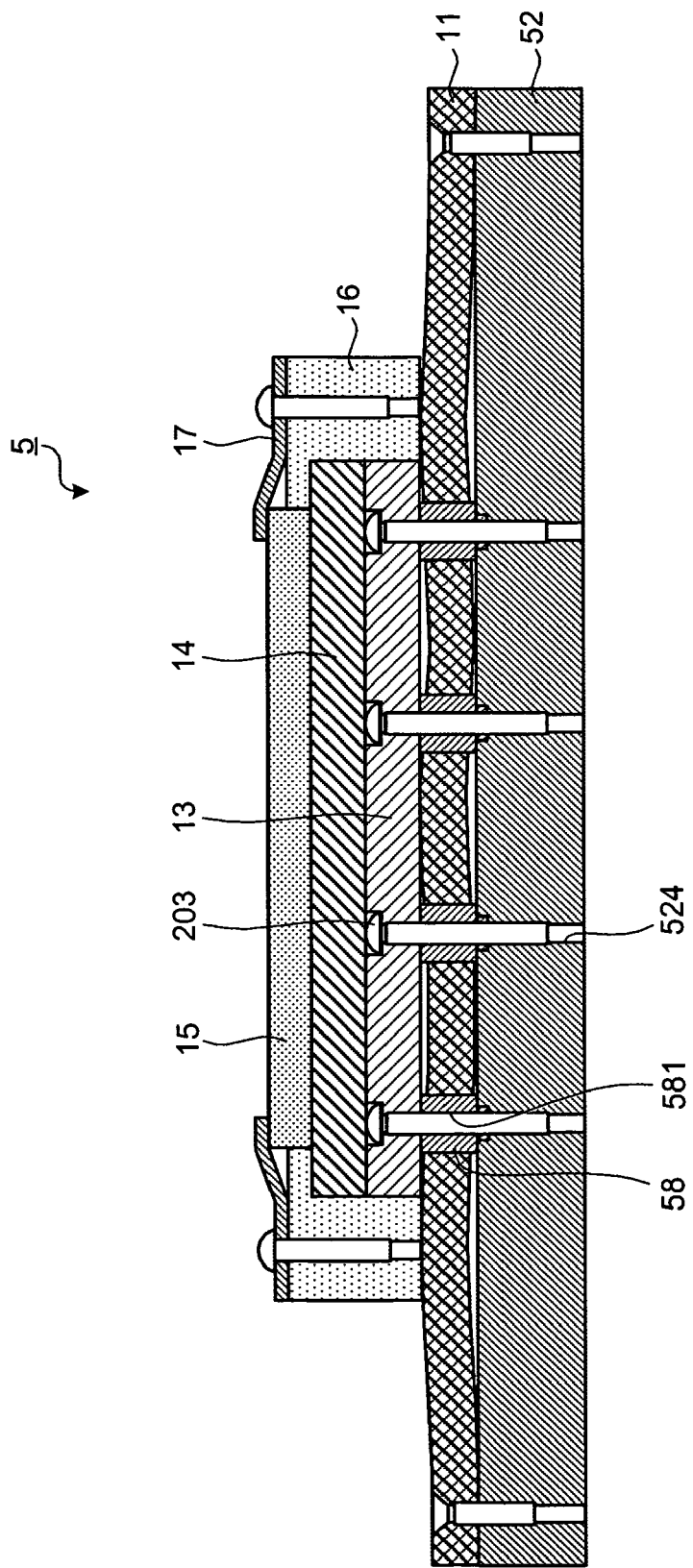
FIG. 8 is a sectional view of the structure of a probe card according to a first modification of the first embodiment of the present invention.

FIG. 8 is a longitudinal sectional view of the structure of a probe card according to a first modification of the first embodiment. A probe card 5 shown in FIG. 8 includes, like the probe card 1 described above, the substrate 11, a reinforcing member 52, the interposer 13, the space transformer 14, the probe head 15, the holding member 16, the leaf spring 17, and a plurality of post members 58 (first post members).

In the first modification, a method of fastening the reinforcing member 52 and the interposer 13 is different from that in the first embodiment described above. Specifically, when the reinforcing member 52 (although not shown in the drawings, like the reinforcing member 12, the reinforcing member 52 has an outer peripheral portion 521, a central portion 522, and a plurality of coupling portions 523) and the interposer 13 are fastened, the reinforcing member 52 and the interposer 13 are fastened by screws 203 (first screw members configuring a first fastening member) that reach from the interposer 13 to the reinforcing member 52 while being inserted through hollow portions 581 (first hollow portions) of the post members 58 from one ends thereof. Therefore, screw threads are not formed on inner sides of the hollow portions of the post members 58. Instead, screw threads are formed in appropriate places of inner sides of hole portions 524 for screw insertion of the reinforcing member 52. According to the first modification of the first embodiment explained above, because the interposer 13 and the reinforcing member 52 are fastened by using one screw 203 in each of fastening places, it is possible to reduce the number of components.

Figure 9:
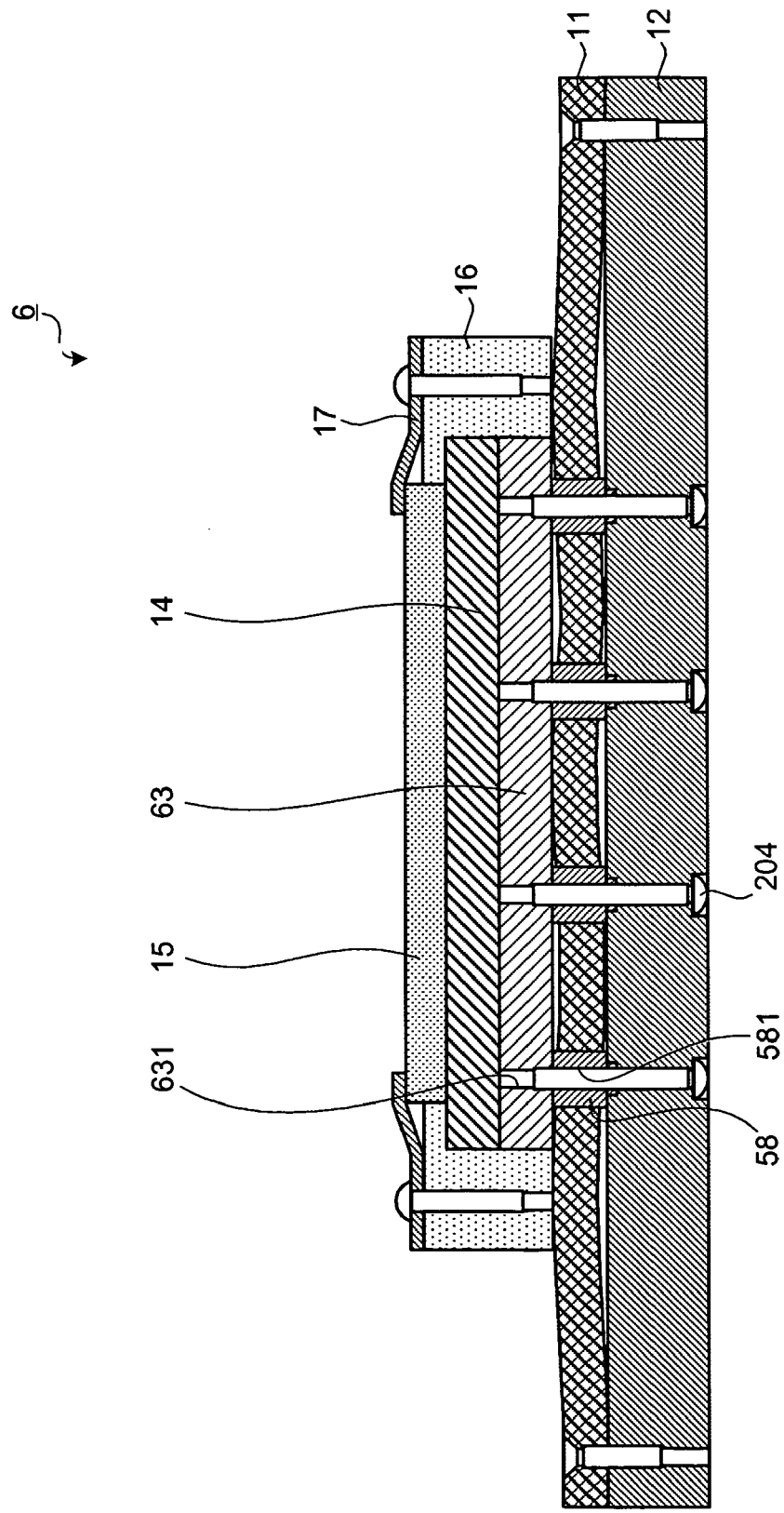
FIG. 9 is a sectional view of the structure of a probe card according to a second modification of the first embodiment of the present invention.

FIG. 9 is a longitudinal sectional view of the structure of a probe card according to a second modification of the first embodiment. In a probe card 6 shown in FIG. 9, like the probe card 5 described above, the reinforcing member 12 and an interposer 63 are fastened by screws 204 (first screw members configuring a first fastening member).

In the second modification, the screws 204 are inserted from the side of the reinforcing member 12. Therefore, screw threads are formed in appropriate positions of hole portions 631 for screw insertion of the interposer 63. The probe card 6 is basically the same configuration as the probe card 5 described above except for the structure of the interposer 63 and a method of fastening the screws 204. Therefore, in FIG. 9, like reference numerals refer to components corresponding to those of the probe card 5 shown in FIG. 8. In the second modification of the first embodiment described above, as in the first modification, it is possible to reduce the number of components.

Figure 10:
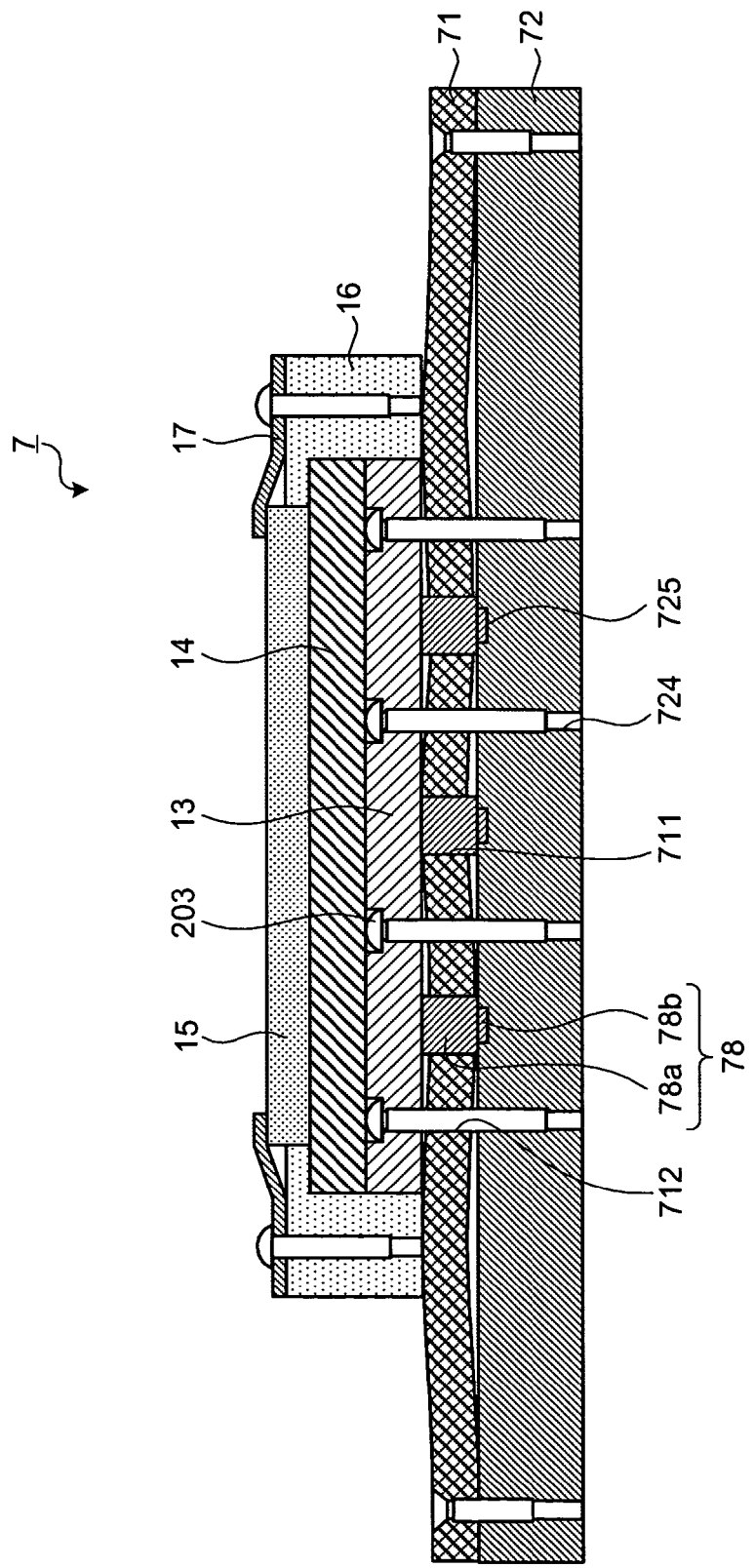
FIG. 10 is a sectional view of the structure of a probe card according to a third modification of the first embodiment of the present invention.

FIG. 10 is a longitudinal sectional view of the structure of a probe card according to a third modification of the first embodiment. A probe card 7 shown in FIG. 10 has a characteristic in that the screws 203 for fastening a reinforcing member 72 (although not shown in the drawings, like the reinforcing member 12, the reinforcing member 72 has an outer peripheral portion 721, a central portion 722, and a plurality of coupling portions 723) and the interposer 13 are inserted through places different from places where post members 78 are embedded.

A substrate 71 has hole portion's 711 through which large diameter portions 78a of the post members 78 are inserted and hole portions 712 through which the screws 203 are inserted. The reinforcing member 72 has hole portions 724 through which the screws 203 are inserted and in which screw threads are formed in predetermined places and groove portions 725 in which small diameter portions 78b of the post members 78 are placed. The post members 78 do not have hollow portions unlike the post members described above because screws are not inserted through the post members 78. Otherwise, the probe card 7 is of basically the same configuration as the probe card 1 and, in FIG. 10, like reference numerals refer to components corresponding to those of the probe card 1 shown in FIG. 3.

According to the third modification of the first embodiment explained above, the post members 78 have a shape not including hollow portions and shape stability thereof increases. Therefore, it is possible to further improve accuracy of the flatness and parallelism of the probe card.

In the third modification, as in the second modification, the screws can be inserted from the substrate side. In this case, it goes without saying that screw threads are formed in the hole portions of the interposer.

Second Embodiment

Figure 11:
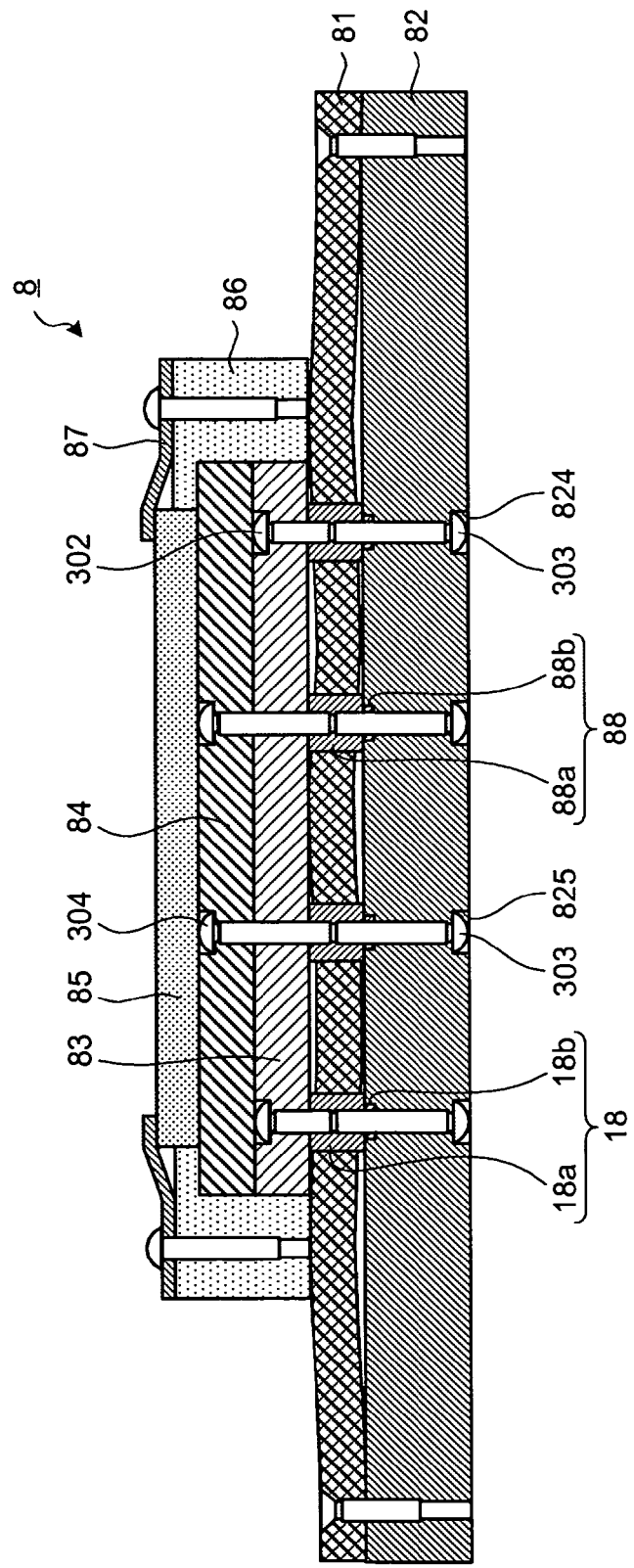
FIG. 11 is a sectional view of the structure of a probe card according to a second embodiment of the present invention.
Figure 12:
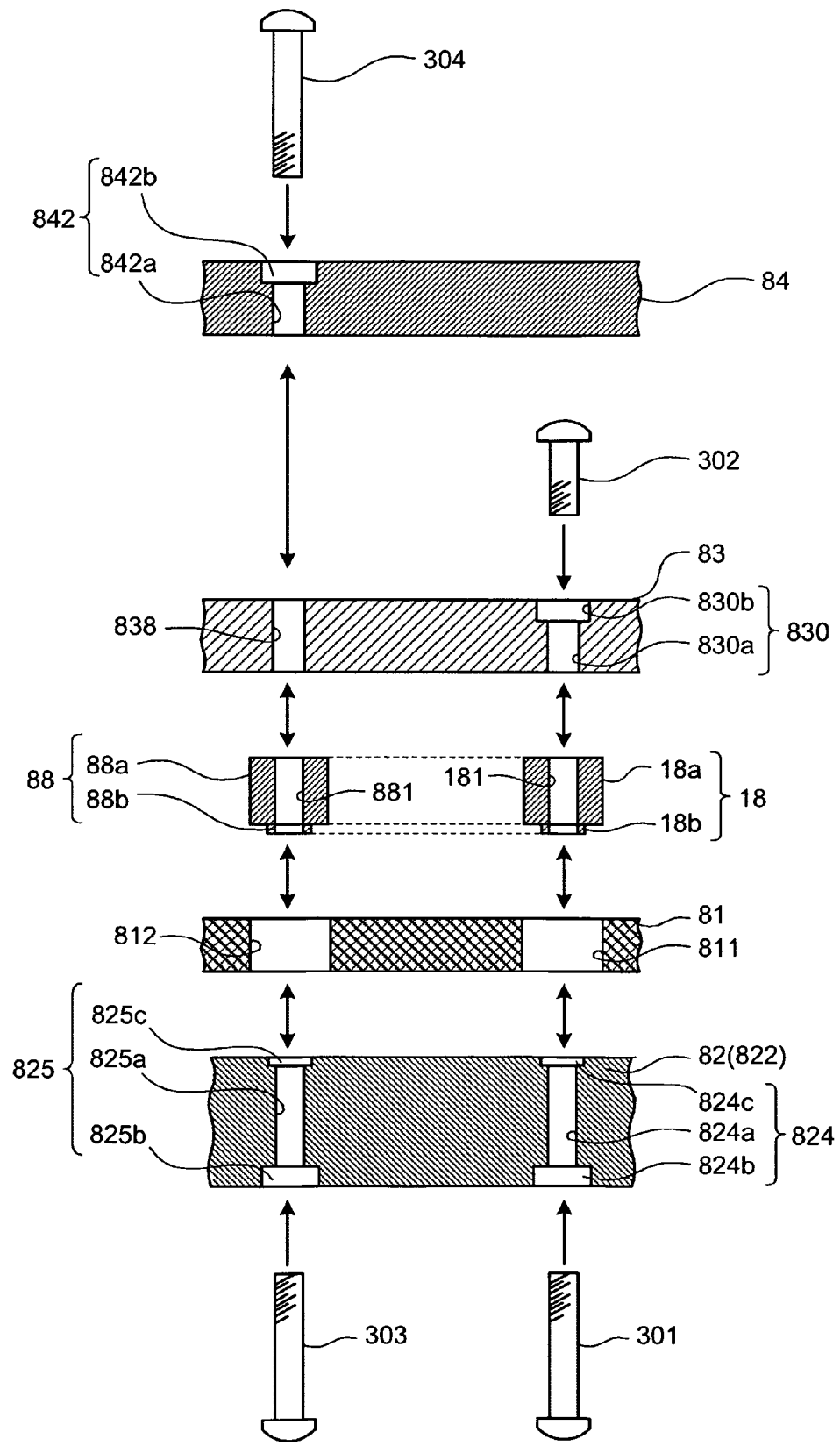
FIG. 12 is a diagram of an overview of assembly of relevant part of the probe card according to the second embodiment of the present invention.

FIG. 11 is a sectional view of the structure of a probe card according to a second embodiment of the present invention. FIG. 12 is a diagram of an overview of assembly of relevant part of the probe card according to the second embodiment. A probe card 8 shown in FIGS. 11 and 12 electrically connects, using a plurality of probes, a semiconductor wafer as a test object and a testing device. The probe card 8 includes a substrate 81 that is formed in a thin disc shape and realizes electrical connection with the testing device, a reinforcing member 82 that is mounted on one side of the substrate 81 and reinforces the substrate 81, an interposer 83 for connection of wires from the substrate 81, a space transformer 84 that transforms intervals among the wires to be connected through the interposer 83, a probe head 85 that is formed in a disc shape having a diameter smaller than that of the substrate 81 and stacked on the space transformer 84 and houses and holds a plurality of probes in association with the semiconductor wafer as the test object, a holding member 86 that is fixed to the substrate 81 and collectively holds the interposer 83 and the space transformer 84 in a stacked state, a leaf spring 87 that is fixed to the holding member 86 and fixes an end of the probe head 85, and a plurality of post members 18 (first post members) and 88 (second post members) embedded in predetermined places of the substrate 81, respectively.

A top view of the probe card 8 is the same as that of the probe card 1 of the first embodiment shown FIG. 2. FIG. 11 corresponds to a sectional view taken along line A-A in FIG. 2.

The more detailed structure of the probe card 8 is explained below. Like the substrate 11 according to the first embodiment, the substrate 81 is made of an insulating material such as Bakelite or epoxy resin. In the substrate 81, a wiring layer (a wiring pattern) for electrically connecting the probes and the testing device is three-dimensionally formed by via-holes and the like. In the substrate 81, hole portions 811, through which the post members 18 are inserted, are provided in the same number as the post members 18 and hole portions 812, through which the post members 88 are inserted, are provided in the same number as the post members 88. In FIG. 11, a state in which the substrate 81, which is originally flat, deforms and a longitudinal section of the substrate 81 is wavy is shown.

The reinforcing member 82 has the same shape as that of the reinforcing member 12 (see FIG. 1) and includes an outer peripheral portion 821, a central portion 822, and a plurality of coupling portions 823 (not shown) corresponding to the outer peripheral portion 121, the central portion 122, and the coupling portions 123 of the reinforcing member 12, respectively. A plurality of hole portions 824, through which the screws 301 are inserted, are formed in the central portion 822. The hole portions 824 have small diameter holes 824a having the same diameter as the screw portions of the screws 301, large diameter holes 824b that can house the screw heads of the screws 301, and medium diameter holes 824c in which the post members 18 are placed. A plurality of hole portions 825, through which screws 303 are inserted, are formed in the central portion 822. The hole portions 825 have small diameter holes 825a having the same diameter as the screw portions of the screws 303, large diameter holes 825b that can house the screw heads of the screws 303, and medium diameter holes 825c in which the post members 88 are placed. Like the reinforcing member 12, the reinforcing member 82 is realized by a highly rigid material.

Figure 13:
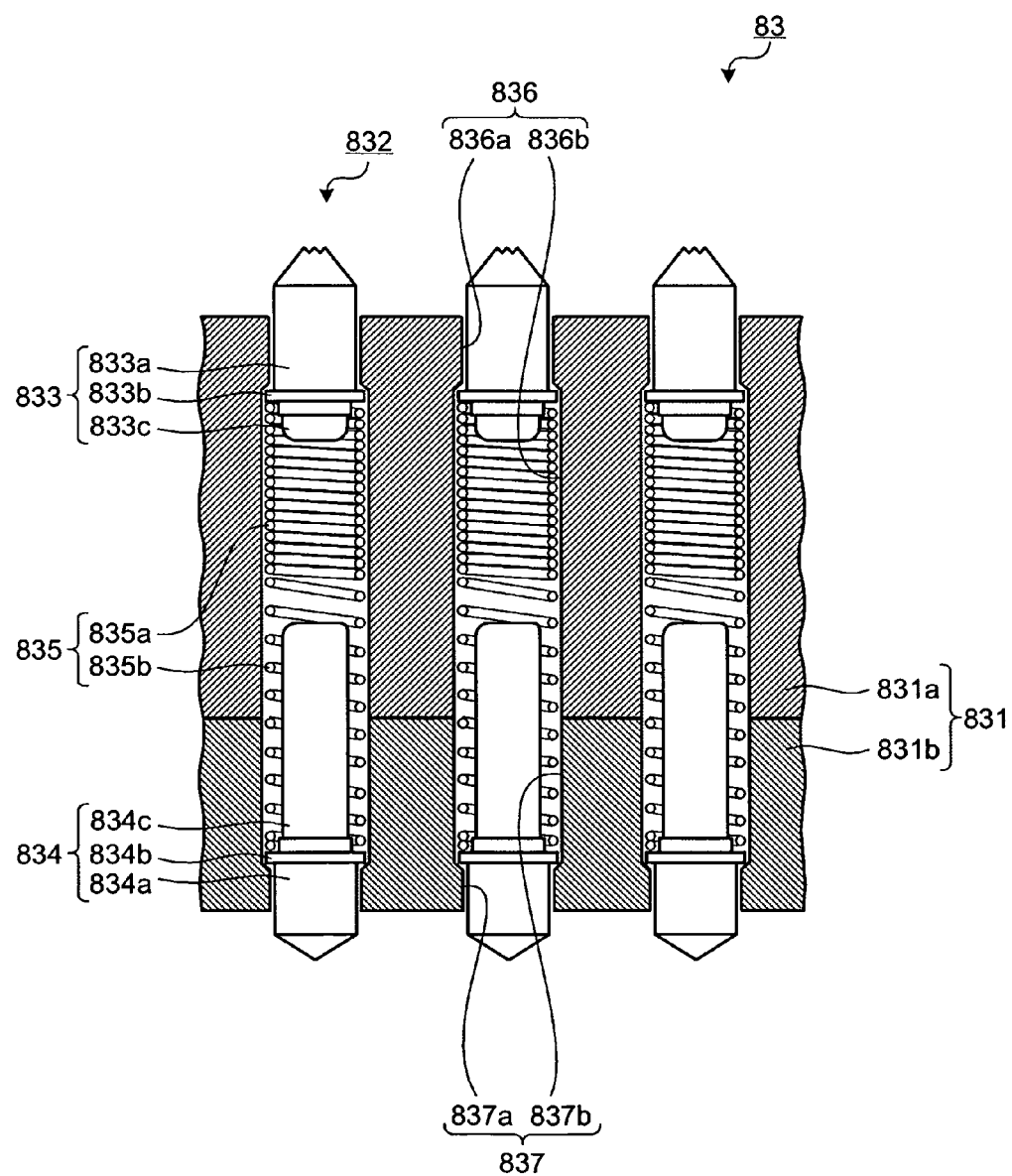
FIG. 13 is a partial sectional view of the internal structure of an interposer included in the probe card according to the second embodiment of the present invention.

The interposer 83 has a regular octagonal surface and is formed in a thin plate shape. In the interposer 83, a plurality of hole portions 830, through which the screws 302 are inserted, are formed. The hole portions 830 have small diameter holes 830a having the same diameter as the screw portions of the screws 302 and large diameter holes 830b having a diameter that can house the screw heads of the screws 302. FIG. 13 is an enlarged partial sectional view of the detailed internal structure of the interposer 83. As shown in FIG. 13, in the interposer 83, a plurality of connection terminals 832 are housed and held in a housing 831. The connection terminals 832 include needle-like members 833 that come into contact with the space transformer 84 when the space transformer 84 is assembled, needle-like members 834 that come into contact with the substrate 81 when the substrate 81 is assembled, and spring members 835 that are provided between the needle-like members 833 and the needle-like members 834 and resiliently couple the two kinds of needle-like members 833 and 834. The needle-like members 833 and 834 coupled to each other and the spring members 835 have identical axes. The needle-like members 833 and 834 have tapered tip shapes, respectively. One of the needle-like members 833 and 834 are first needle-lime members and the other of the needle-like members 833 and 834 are second needle-like members.

The needle-like members 833 include needle-like portions 833a having a tip from which a plurality of pawls project (in a crown shape), flange portions 833b that are provided on base end portions on the opposite side of tips of the needle-like portions 833a and have a diameter larger than that of the needle-like portions 833a, and boss portions 833c that project from surfaces on the opposite side of sides of the flange portions 833b in contact with the needle-like portions 833a and have a diameter smaller than that of the flange portions 833b. The needle-like members 833 are formed in a shape axially symmetrical in a longitudinal direction thereof.

The needle-like members 834 include needle-like portions 834a that have sharp tips projecting in a tip direction, flange portions 834b that are provided in base end portions on the opposite side of the tips of the needle-like portions 834a and have a diameter larger than a diameter of the needle-like portions 834a, and boss portions 834c that project from surfaces on the opposite side of sides of the flange portions 834b in contact with the needle-like portions 834a and have a diameter smaller than the diameter of the flange portions 834b. The needle-like members 834 are formed in a shape axially symmetrical in a longitudinal direction thereof. The diameter of the flange portions 834b is the same as that of the flange portions 833b. The diameter of the boss portions 834c is the same as that of the boss portions 833c.

Shapes of the needle-like portions 833a and 834a only have to be decided according to shapes and materials of members with which the needle-like portions 833a and 834a come into contact. Both the crown shape and the sharp tip shape are applicable as the shapes.

The needle-like member 833 sides of the spring members 835 are tightly wound portions 835a, while the needle-like member 834 sides thereof are loosely wound portions 835b. Ends of the tightly wound portions 835a are wound around the boss portions 833c. Ends of the loosely wound portions 835b are wound around the boss portions 834c. The tightly wound portions 835a and the flange portions 833b are joined and the loosely wound portions 835b and the flange portions 834b are joined by any one of a spring winding force and soldering or both. In the connection terminals 832 having the structure described above, with the spring members 835, the needle-like members 833 and 834 are resiliently movable in the up and down directions in FIG. 13.

The housing 831 that houses the connection terminals 832 having the structure described above is formed of a layer of a first member 831a and a second member 831b. Hole portions 836 each housing one of the connection terminals 832 are formed in the first member 831a. The hole portions 836 include small diameter holes 836a having a diameter slightly larger than that of the needle-like portions 833a and large diameter holes 836b having a diameter slightly larger than that of the flange portions 833b. The small diameter holes 836a and the large diameter holes 836b are formed in stepped hole shapes having the same axes.

Hole portions 837 each housing one of the connection terminals 832 are formed in the second member 831b. The hole portions 837 include small diameter holes 837a having a diameter slightly larger than that of the needle-like portions 834a and large diameter holes 837b having a diameter slightly larger than that of the flange portions 834b. The small diameter holes 837a and the large diameter holes 837b are formed in stepped hole shapes having the same axes. As described above, the diameter of the flange portions 833b and that of the flange portions 834b are equal. Therefore, the diameter of the large diameter holes 836b and that of the large diameter holes 837b are also equal. When the first member 831a and the second member 831b are combined, the hole portions 836 and the hole portions 837 smoothly communicate with each other in the axial direction.

In an initial state shown in FIG. 4, the flange portions 833b of the needle-like members 833 come into contact with step portions forming boundaries between the large diameter holes 836b and the small diameter holes 836a in the hole portions 836 of the first member 831a to thereby perform a function of preventing the needle-like members 833 from coming off from the housing 831. Similarly, the flange portions 834b of the needle-like members 834 come into contact with step portions forming boundaries between the small diameter holes 837a and the large diameter holes 837b in the hole portions 837 of the second member 831b to thereby perform a function of preventing the needle-like members 834 from coming off from the housing 831.

Figure 14:
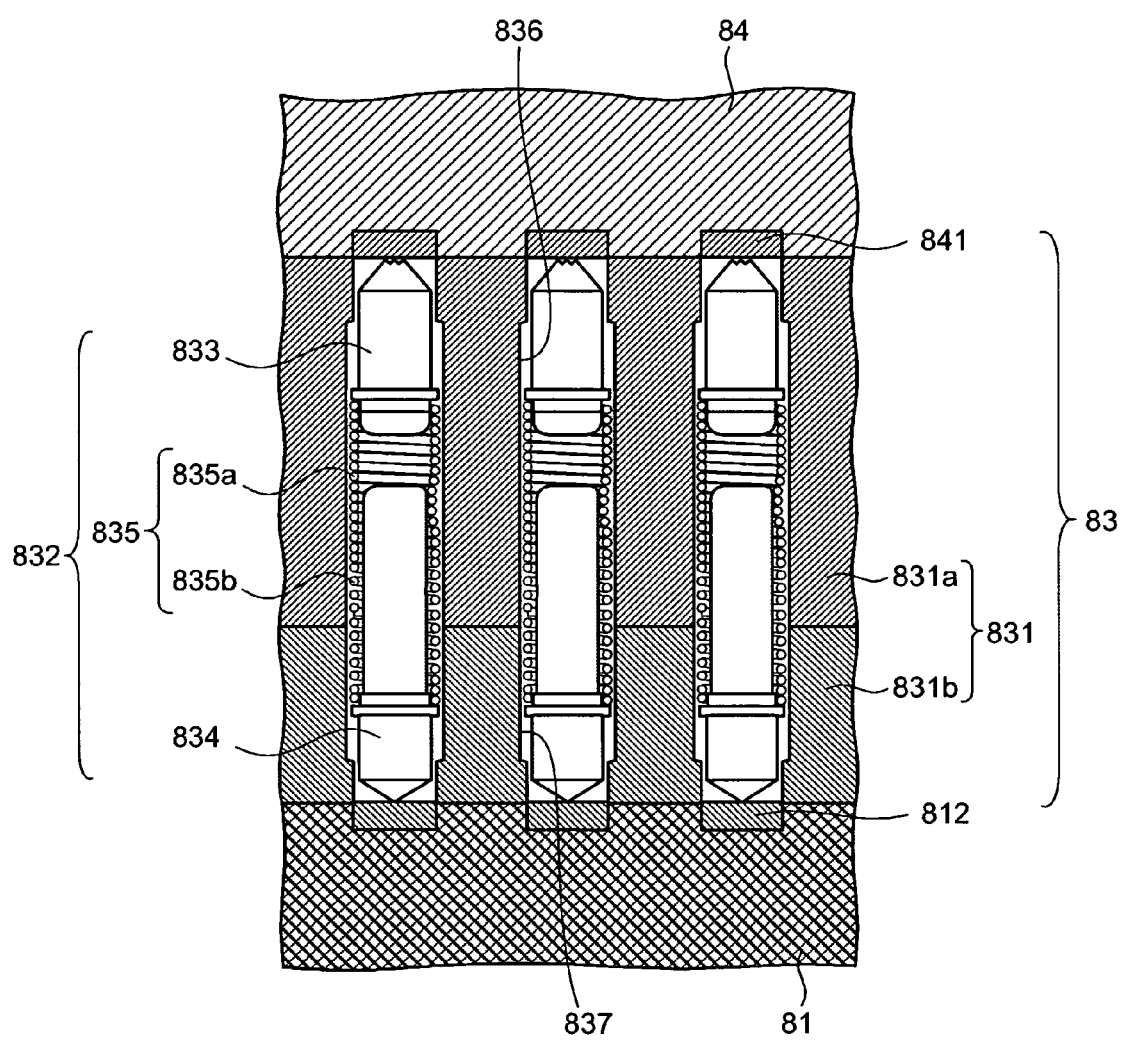
FIG. 14 is a diagram of the structure around the interposer in the probe card according to the second embodiment of the present invention.

FIG. 14 is a diagram of the structure around the interposer 83 of the probe card 8. As shown in FIG. 14, the interposer 83 is interposed between the substrate 81 and the space transformer 84. The tips of the needle-like members 833 come into contact with electrode pads 841 of the space transformer 84 and, on the other hand, the tips of the needle-like members 834 come into contact with electrode pads 812 of the substrate 81, whereby the interposer 83 establishes electrical connection between the substrate 81 and the space transformer 84.

In a state shown in FIG. 14, a part of the tightly wound portions 835a are in contact with the boss portions 833c of the needle-like members 833. Therefore, a linear electric signal along the axial direction of the connection terminals 832 flows to the tightly wound portions 835a, an electric signal does not flow in a coil shape to the loosely wound portions 835b. Thus, an increase in the inductance of the connection terminals 832 can be suppressed.

In the above explanation, the needle-like members 833 and 834 of the connection terminals 832 applied to the interposer 83 have the different shapes. However, needle-like members having the same shape can be connected by the spring members 835.

To the interposer 83 explained above are applied the connection terminals 832 including the coil springs and having the axes parallel to one another. Therefore, the connection terminals 832 move independently from one another and it is possible to cause the interposer 83 to follow deformation of the substrate 81 and the space transformer 84. As a result, it is possible to prevent a part of the wires from being cut by the deformation of any one of the substrate 81 and the space transformer 84 or both and it is possible to absorb a difference between a coefficient of thermal expansion of a semiconductor wafer 4 and that of the substrate 81.

When the interposer 83 is compared to the one in which the leaf springs are used as the connection terminals in an identical space, a load and a stroke exerted to the connection terminals of the interposer 83 can be increased. As a result, it is possible to realize a further reduction in space in the interposer 83 than in the one using leaf springs. Therefore, it is possible to sufficiently cope with an increase in probe pins and a reduction in pitches that follow an increase in the density of wires on a semiconductor wafer involved in a reduction in size of electronic apparatuses in recent years.

Moreover, in the interposer 83, the connection terminals 832 are only inserted in the housing 831 and are not fixed to the housing 831 by soldering or the like. Therefore, when there is a defect in one of the connection terminals 832, only the defective one can be replaced and it is possible to perform maintenance easily at low cost.

The post members 18 and 88 are explained with reference to FIGS. 11 and 12. As explained in the first embodiment, the post members 18 include the large diameter portions 18a and the small diameter portions 18b and have the hollow portions 181 (the first hollow portions) passing through the post members 18 along a center axis direction (a height direction) thereof. The hollow portions 181 have the same diameter as the small diameter holes 824a of the hole portions 824 and the small diameter holes 830a of the hole portions 830. Screw threads in which the screws 301 and 302 can be screwed are provided on inner sides of the hollow portions 181 (not shown). Like the post members 18, the post members 88 have large diameter portions 88a of a hollow cylindrical shape having thickness slightly larger than the thickness of the substrate 81 and small diameter portions 88b of a hollow cylindrical shape having a diameter smaller than that of the large diameter portions 88a and having the same center axes as those of the large diameter portions 88a. The post members 88 have hollow portions 881 (second hollow portions) passing through the post members 88 along a center axis direction (a height direction) thereof. The hollow portions 881 has the same diameter as the small diameter holes 825a of the hole portions 825, the hole portions 838, and small diameter holes 842a of hole portions 842 of the space transformer 84 described later. Screw threads in which the screws 303 and 304 can be screwed are provided on inner sides of the hollow portions 881 (not shown). The height of the post members 88 is the same as that of the post members 18.

A plurality of hole portions 842, through which the screws 304 are inserted, are formed in the space transformer 84. The hole portions 842 have small diameter holes 842a having the same diameter as the screw portions of the screws 304 and large diameter holes 842b having a diameter that can house the screw heads of the screws 304.

The probe head 85, the holding member 86, and the leaf spring 87 have the same structure as the space transformer 14, the probe head 15, the holding member 16, and the leaf spring 17 included in the probe card 1 according to the first embodiment, respectively. Probes housed and held in the probe head 85 are the probes 2 explained in the first embodiment.

An overview of assembly of the probe card 8 is explained with referenced to FIG. 12. First, the reinforcing member 82 and the interposer 83 are fastened via the substrate 81. In this case, positioning of the substrate 81 and the reinforcing member 82 is performed, the post members 18 are embedded in the hole portions 811, and, on the other hand, the post members 88 are embedded in the hole portions 812. Thereafter, the screws 301 are inserted from the hole portions 824 and screwed into the post members 18 and the screws 303 are inserted from the hole portions 825 and screwed into the post members 88 to fasten the post members 18 and 88 to the reinforcing member 82. Subsequently, the interposer 83 is arranged in a predetermined position on a surface on the opposite side of the surface on which the reinforcing member 82 is mounted of the surface of the substrate 81. The screws 302 are inserted from the hole portions 830 formed for screw insertion of the interposer 83 and screwed into the post members 18 to fasten the post members 18 to the interposer 83. According to the process described above, the reinforcing member 82 and the interposer 83 are fastened via the post members 18 embedded in the substrate 81. In this sense, a pair of screws 301 and 302 screwed into from both the end opening surfaces of the same hollow portion 181 are the first screw members configuring the first fastening member.

Thereafter, the space transformer 84 and the interposer 83 are stacked in layers and the screws 304 are inserted from the large diameter holes 842b to the small diameter holes 842a of the hole portions 842 of the space transformer 84 and screwed into the post members 88. Consequently, the space transformer 84 is fixed to the reinforcing member 82 via the post members 88. In this sense, a pair of screws 303 and 304 screwed from both the openings into the same hollow portion 881 are second screw members configuring a second fastening member.

Figure 15:
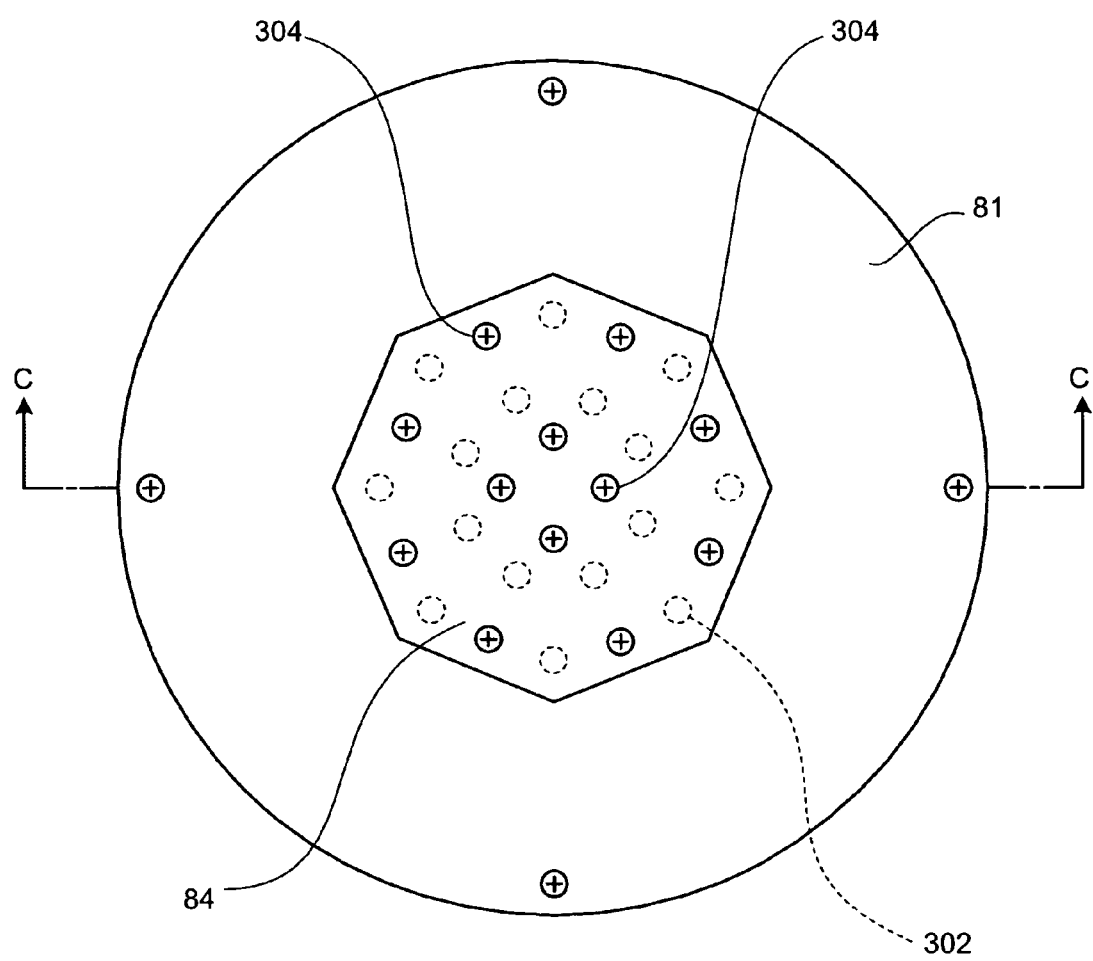
FIG. 15 is a top view of assembled relevant part of the probe card according to the second embodiment of the present invention.

FIG. 15 is a diagram of a state of the interposer 83 and the space transformer 84 fixed to the reinforcing member 82 via the substrate 81 viewed from the space transformer 84 side. FIG. 15 is a diagram equivalent to a top view excluding the components (including the holding member 86) above the space transformer 84 in the sectional view shown in FIG. 11 (the screws 302 inserted through the interposer 83 are indicated by broken lines). In other words, a cross section taken along line C-C in FIG. 15 is nothing but a diagram excluding the components above the space transformer 84 and the holding member 86 in FIG. 11. As shown in FIG. 15, the screws 304 are inserted through the surface of the space transformer 84 (in twelve places in total).

By fastening the interposer 83 and the space transformer 84 to the reinforcing member 82 via the post members 18 and 88 in this way, the width in a thickness direction of the substrate 81 can be defined by the height of the post members 18 and 88 rather than the thickness of the substrate 81. Therefore, even if deformation such as warp, waviness, or irregularity occurs in the flat substrate 81 (see FIG. 11), the probe card 8 is not affected by the deformation. As in the first embodiment, it is possible to improve accuracy of the parallelism and flatness of the probe head 15 with respect to an attachment reference surface in attaching the probe card 8 to a prober. When the reinforcing member 82 is mounted on the substrate 81, the post members 18 and 88 are fixed to the reinforcing member 82 by screwing the screws 301 in the post members 18 and screwing the screws 303 in the post members 88. Consequently, as in the first embodiment, it is possible to improve workability in assembling the probe card 8.

Because the space transformer 84 and the reinforcing member 82 are fastened, it is possible to control deformation including warp and waviness of the space transformer 84 caused by reaction of the connection terminals 832 included in the interposer 83.

After the space transformer 84 and the reinforcing member 82 are fastened as described above, a predetermined pressure is applied to the space transformer 84 by fastening the holding member 86 to the substrate 81. Thereafter, positioning of the probe head 85 in which the probes 2 are housed is performed and the leaf spring 87 is fixed to the holding member 86, whereby the probe card 8 is completed.

Figure 16:
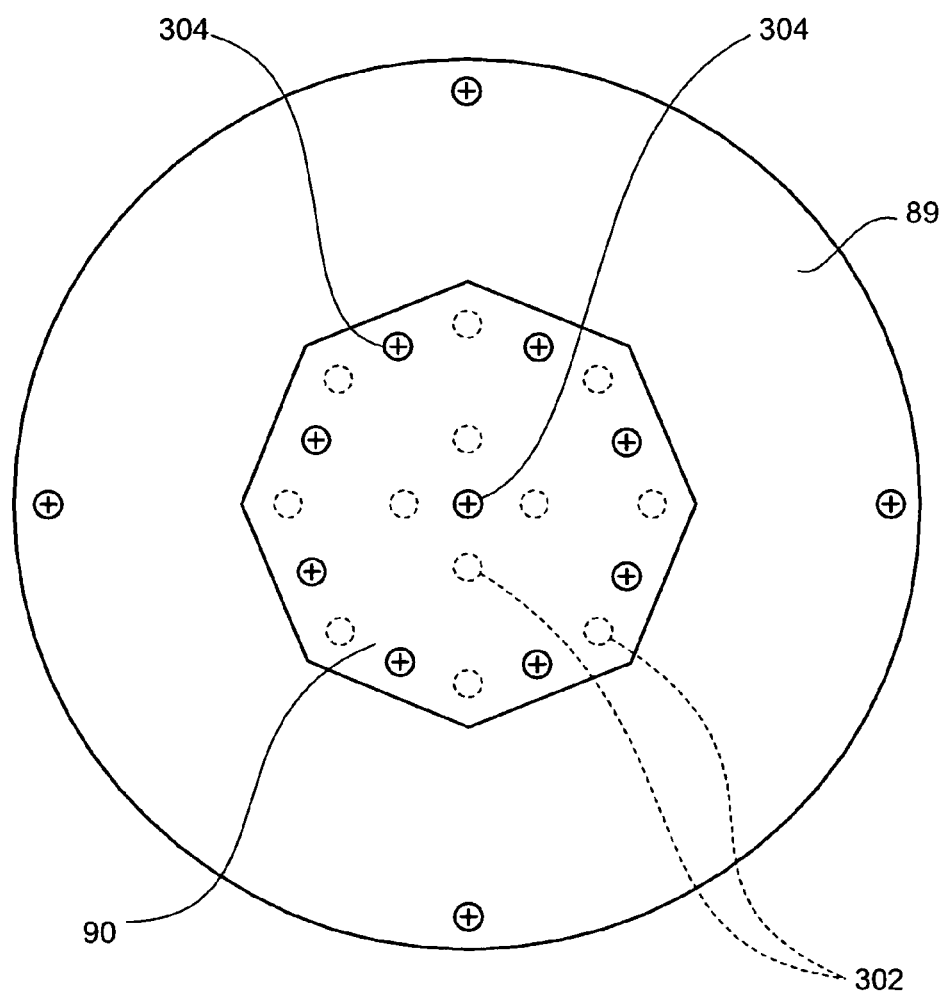
FIG. 16 is a top view of assembled relevant part of a probe card according to a modification of the second embodiment of the present invention.

The arrangement of the screws 304 shown in FIG. 15 is only an example. Besides, for example, the screws 304 can be arranged as shown in FIG. 16 to fasten a reinforcing member (not shown) and a space transformer 90 via a substrate 89. As shown in FIG. 16, one of the screws 304 penetrates through the space transformer 90 passing through the center of gravity of the space transformer 90. Consequently, it is possible to obtain a remarkable effect in preventing the deformation.

With the probe card according to the second embodiment of the present invention explained above, the probe card includes a plurality of probes that are made of a conductive material and come into contact with the semiconductor wafer to input or output an electric signal, a probe head that houses and holds the probes, a flat substrate that has a wiring pattern corresponding to a circuit structure for generating a signal for a test, a reinforcing member that is mounted on the substrate and reinforces the substrate, an interposer that is stacked on the substrate for connection of wires of the substrate, a space transformer that is interposed and stacked between the interposer and the probe head, transforms intervals among the wires to be connected through the interposer, and leads out the wires to a surface on a side opposed to the probe head, a plurality of first post members that are embedded piercing through the substrate from the surface of a portion on which the interposer is stacked, and have height larger than the thickness of the substrate, a first fastening member for fastening the substrate and the interposer, a second fastening member for fastening the substrate and the space transformer, and second post members that have the same height as the first post member and in which the second fastening member is screwed. Consequently, as in the first embodiment, it is possible to improve accuracy of the flatness and parallelism regardless of whether the substrate having the wiring pattern has been deformed.

With the probe card according to the second embodiment, accuracy of tip positions of the probes is also improved according to the improvement of the accuracy of the flatness and parallelism. Therefore, it is possible to control fluctuation in tip positions among the probes, substantially fix strokes of all the probes, and highly accurately realize control for obtaining stable contact resistance. In addition, because the strokes of all the probes are substantially fixed, an unnecessarily large load is not applied to a specific probe. Therefore, the electrode pads are prevented from being excessively damaged. It is possible to prevent deterioration in yield in a process of connecting dies and packages (wire bonding, etc.) and breakage of the wires connected to the electrode pads.

Further, with the probe card according to the second embodiment, the leaf spring uniformly presses the entire circumference near an edge of the probe head surface in a direction of the substrate. Therefore, it is possible to control warp of the interposer, the space transformer, and the probe head besides the substrate and improve accuracy of the flatness and parallelism of the entire probe card.

In addition, with the probe card according to the second embodiment, the probe card includes the first fastening member for fastening the interposer and the reinforcing member and the second fastening member for fastening the space transformer and the reinforcing member. Therefore, it is possible to control deformation of the space transformer caused by reaction of connection terminals included in the interposer. In particular, if a screw penetrates through the space transformer passing through the center of gravity of the space transformer, a remarkable effect is obtained in preventing the deformation.

With the probe card according to the second embodiment, a plurality of connector terminals including coil springs and having axes parallel to one another are applied to the interposer. The respective connection terminals move independently from one another and it is possible to cause the interposer to follow deformation of the substrate and the space transformer. As a result, it is possible to prevent a part of the wires from being cut by the deformation of the substrate and the space transformer.

In the above explanation, the probe card includes both the first fastening member for fastening the interposer and the reinforcing member and the second fastening member for fastening the space transformer and the reinforcing member. It goes without saying that a probe card can be configured by providing only the second fastening member.

Modifications of the Second Embodiment

Figure 17:
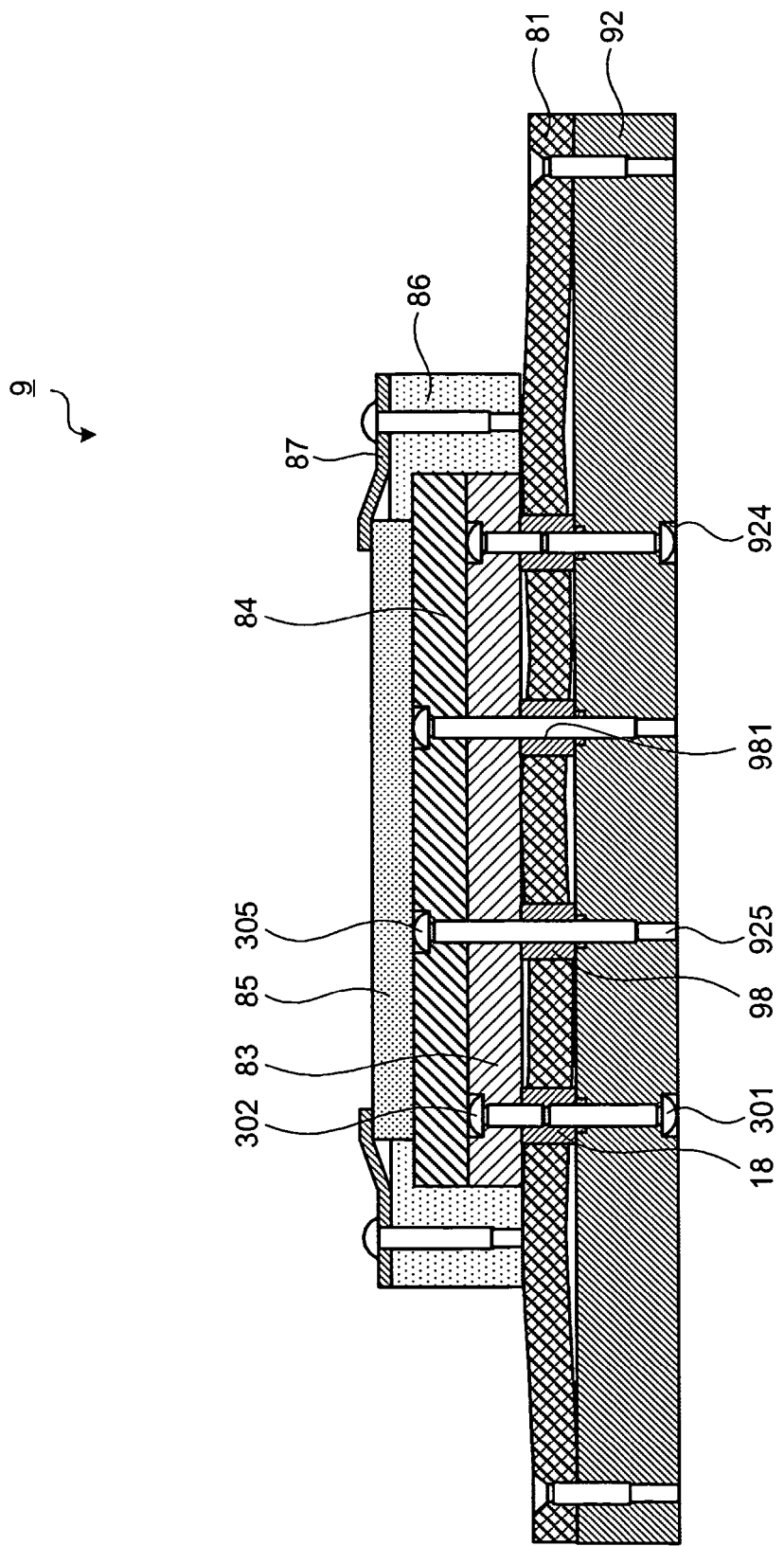
FIG. 17 is a sectional view of the structure of a probe card according to a first modification of the second embodiment of the present invention.

FIG. 17 is a longitudinal sectional view of the structure of the probe card according to a first modification of the second embodiment. A probe card 9 shown in FIG. 17 includes, like the probe card 8, the substrate 81, a reinforcing member 92, the interposer 83, the space transformer 84, the probe head 85, the holding member 86, the leaf spring 87, and a plurality of post members 18 (first post members) and 98 (second post members).

In the first modification, a method of fastening the reinforcing member 92 and the space transformer 84 is different from that in the second embodiment. Specifically, when the reinforcing member 92 (although not shown in the drawings, like the reinforcing member 82, the reinforcing member 92 has an outer peripheral portion 921, a central portion 922, and a plurality of coupling portions 923) and the space transformer 84 are fastened, the reinforcing member 92 and the space transformer 84 are fastened by screws 305 (second screw members configuring a second fastening member) that reach from the space transformer 84 to reinforcing member 92 while being inserted through hollow portions 981 (second hollow portions) of the post members 98 from one ends thereof. Therefore, screw threads are not formed on inner sides of the hollow portions of the post members 98. Instead, screw threads are formed in appropriate places of inner sides of hole portions 925 for screw insertion of the reinforcing member 92. The hole portions 924 for inserting the screws 301 of the reinforcing member 92 is of basically the same configuration as the hole portions 824 of the reinforcing member 82. According to the first modification of the second embodiment explained above, because the space transformer 84 and the reinforcing member 92 are fastened by using one screw 305 in each of fastening places, it is possible to reduce the number of components.

Figure 18:
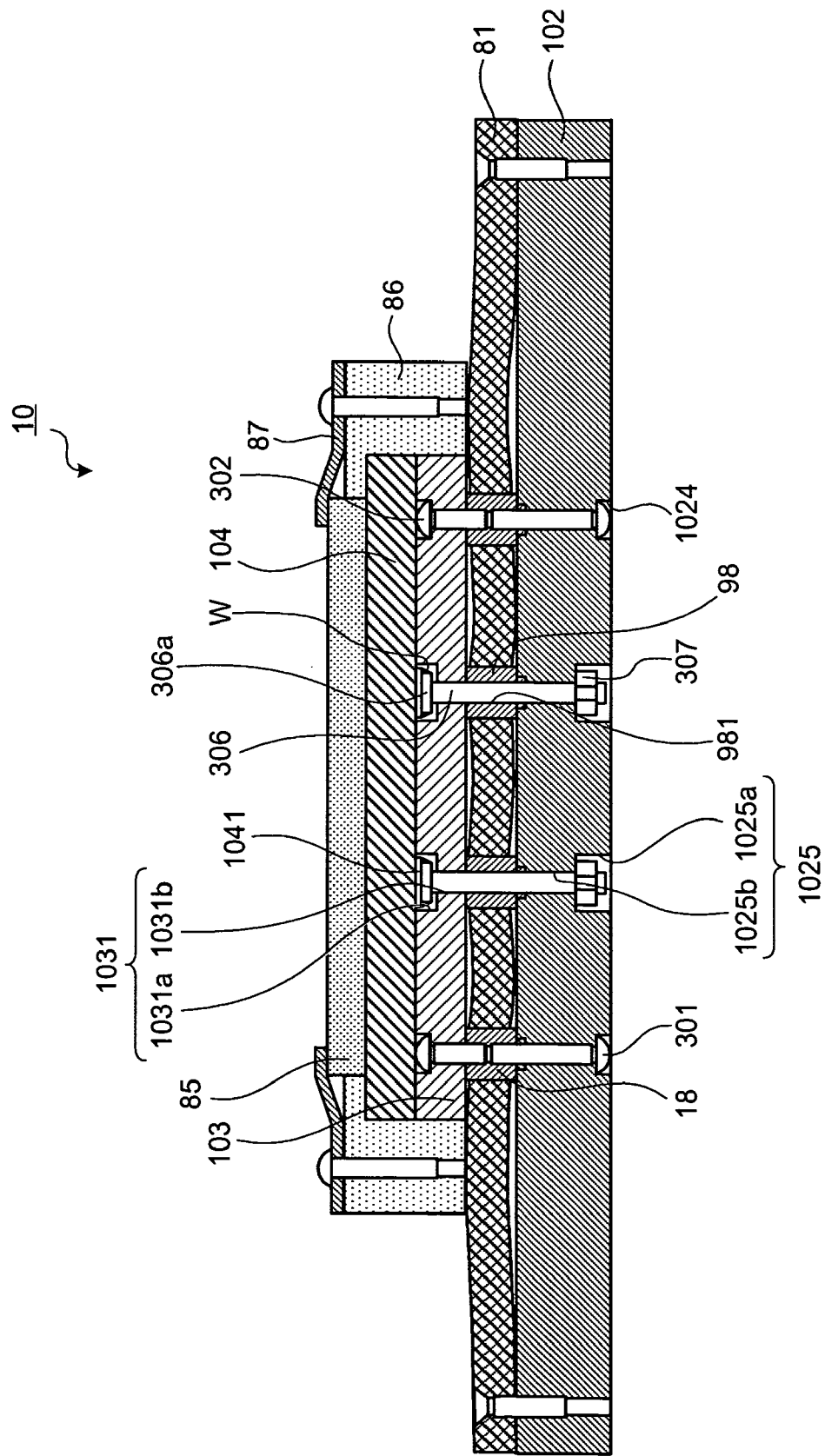
FIG. 18 is a sectional view of the structure of a probe card according to a second modification of the second embodiment of the present invention.

FIG. 18 is a longitudinal sectional view of the structure of a probe card according to a second modification of the second embodiment. The probe card 10 shown in FIG. 18 is different from those according to the second embodiment and the first modification thereof in a method of fastening a reinforcing member 102 (like the reinforcing member 92, the reinforcing member 102 has an outer peripheral portion 1021, a central portion 1022, and a plurality of coupling portions 1023) and a space transformer 104. Specifically, flat ends 306a formed at one ends of bolts 306 inserted through the hollow portions 981 (the second hollow portions) of the post members 98 as the second post member from one ends thereof are brazed to pads 1041, which are provided on a bottom surface of the space transformer 104, by using wax W and, on the other hand, screw threads are provided at the other ends of the bolts 306. The reinforcing member 102 and the space transformer 104 are fastened by tightening nuts 307 from the side of the reinforcing member 102. In this sense, the bolts 306 and the nuts 307 are the second screw members configuring the second fastening member.

Hole portions 1031 of the interposer 103 have large diameter holes 1031a that can house the ends 306a of the brazed bolts 306 and small diameter holes 1031b having the same diameter as the bolts 306. Hole portions 1025 for insertion of the bolts 306 of the reinforcing member 102 have large diameter holes 1025a that can house the nuts 307 and small diameter holes 1025b having the same diameter as the bolts 306.

Otherwise, the probe card 10 is of basically the same configuration as the probe card 8 described above and, in FIG. 18, like reference numerals refer to components of the probe card 10 corresponding to those of the probe card 8 shown in FIG. 11.

According to the second modification of the second embodiment explained above, the bolts 306 are brazed on the opposite side of a surface opposed to the probe head 85 (a bottom surface side in FIG. 18) of the surface of the space transformer 104 and holes are not formed in the space transformer 104. Therefore, wires in the space transformers 104 do not have to be limited.

As other modifications of the second embodiment, it is also possible to change the method of connecting the interposer and the reinforcing member in the same manner as the first to third modifications of the first embodiment. A diameter of screws or bolts for fastening the space transformer and the reinforcing member and a diameter of screws for fastening the interposer and the reinforcing member can be set different. In this case, post members having hollow portions having different diameters for the screws and the bolts only have to be applied.

Third Embodiment

A probe card according to a third embodiment of the present invention is of basically the same configuration as that of the first embodiment except for the structure of an interposer. The probe card of the third embodiment includes the substrate 11, the reinforcing member 12, the space transformer 14, the probe head 15, the holding member 16, and the leaf spring 17. The probe head 15 houses and holds the probes 2 previously described in the first embodiment.

Figure 19:
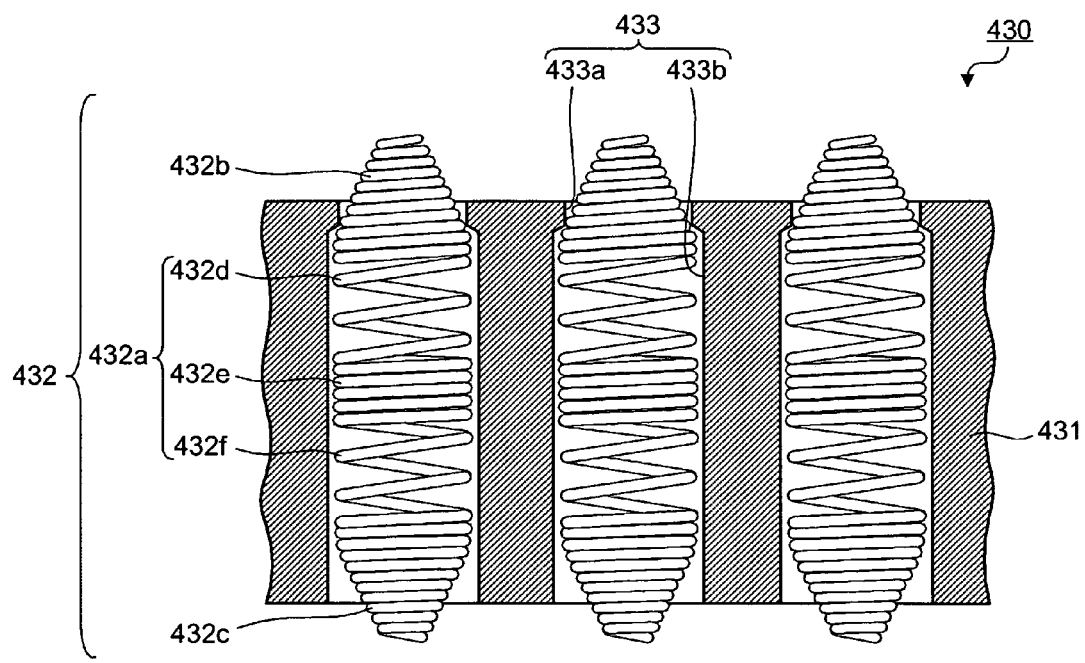
FIG. 19 is a partial sectional view of the internal structure of an interposer included in a probe card according to a third embodiment of the present invention.

The structure of the interposer applied to the probe card of the third embodiment is explained in detail below. FIG. 19 is a partial longitudinal sectional view of the structure of the interposer applied to the probe card according to the third embodiment. An interposer 430 shown in FIG. 19 includes a housing 431 as a base material and a plurality of connection terminals 432 housed and held in the housing 431.

The connection terminals 432 are formed in a coil shape formed by winding a conductive material. The connection terminals 432 include coil spring portions 432a wound to have a cylindrical shape and a pair of electrode pin portions 432b and 432c tightly wound in a tapered shape from both ends of the coil spring portions 432a. The coil spring portions 432a include constantly wound portions 432d, tightly wound portions 432e, and loosely wound portions 432f formed at pitches relatively rougher than the constantly wound portions 432d. With the connection terminals 432 having such structure, it is possible to prevent a tangle from occurring in the coil spring portions 432a when the connection terminals 432 are compressed and deformed.

The housing 431 is made of a single member. Hole portions 433 that individually house the connection terminals 432 are formed in the housing 431. The hole portions 433 include small diameter holes 433a that hold the electrode pin portions 432b and prevent it from coming off and large diameter holes 433b that have a diameter slightly larger than that of intermediate portions of the connection terminals 432. The small diameter holes 433a and the large diameter holes 433b are formed in a stepped hole shape having the same axes. When the connection terminals 432 are inserted in the housing 431 having such structure, the connection terminals 432 are inserted from end opening surfaces of the large diameter holes 433b.

Figure 20:
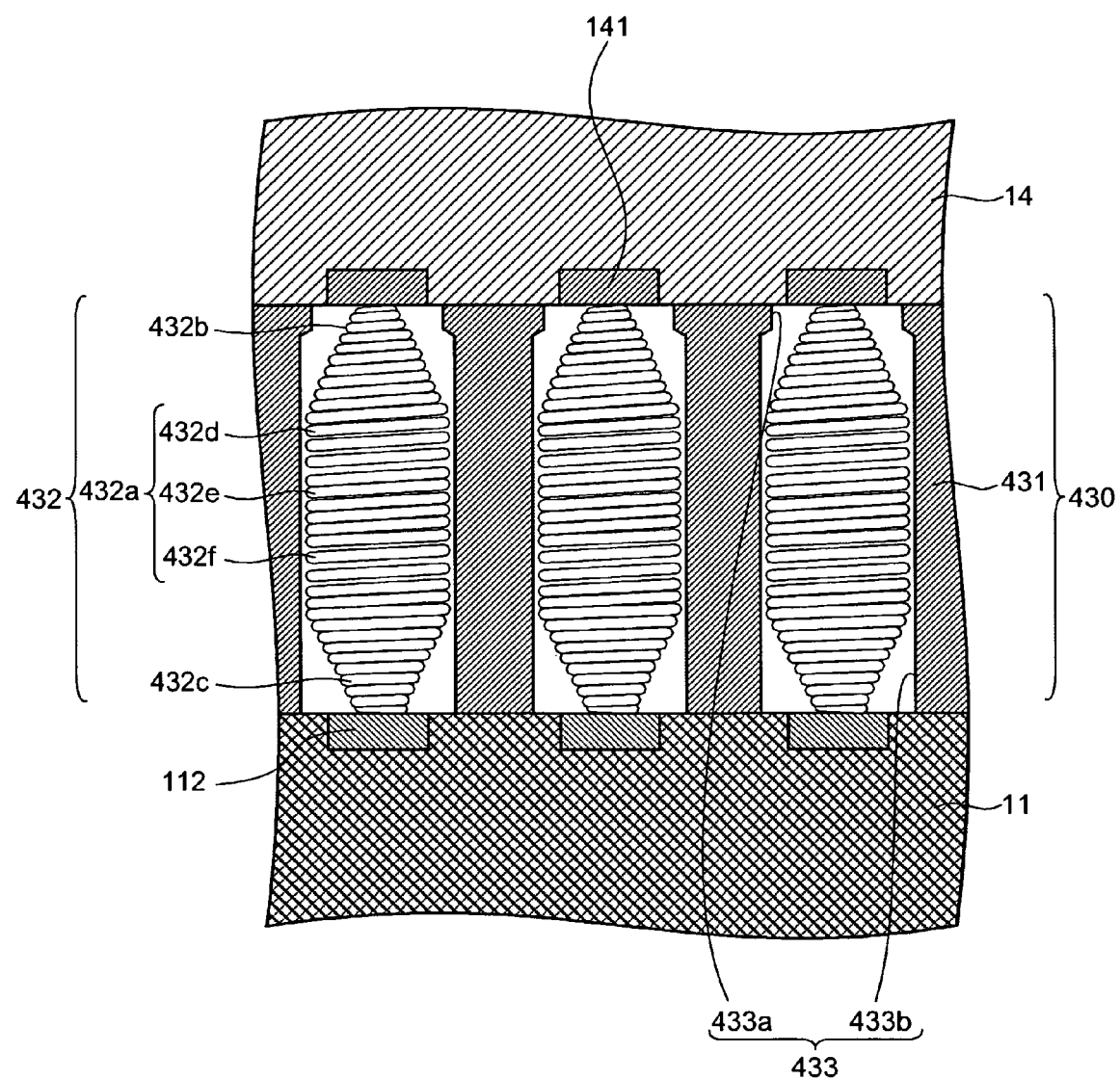
FIG. 20 is a diagram of the structure around the interposer in the probe card according to the third embodiment of the present invention.

FIG. 20 is a diagram of the structure around the interposer 430 in the probe card. In a state shown in FIG. 20, the constantly wound portions 432d and the loosely wound portions 432f of the coil spring portions 432a bend and come into a substantially closely attached state and tips of the electrode pin portions 432b of the connection terminals 432 come into contact with the electrode pads 141 of the space transformer 14. On the other hand, tips of the electrode pin portions 432c of the connection terminals 432 come into contact with the electrode pads 112 of the substrate 11 to thereby establish electrical connection between the substrate 11 and the space transformer 14.

Because the electrode pin portions 432b and 432c are tightly wound, electricity is transmitted in a substantially axial direction via portions that are in contact with an axial direction of windings. Therefore, an electric signal does not flow in a coil shape in the electrode pin portions 432b and 432c. Consequently, the numbers of windings of the electrode pin portions 432b and 432c do not affect electric performance including the impedance of the connection terminals 432.

The electrode pin portions 432b and 432c are formed in a tapered shape and resiliently in contact with the electrode pads 112 and 141, respectively. Therefore, it is possible to reduce fluctuation in positions of projecting ends of the electrode pin portions 432b and 432c and bring the projecting ends into uniform contact with contacted members.

With the probe card according to the third embodiment of the present invention explained above, the same effect as is achieved in the first embodiment can also be achieved.

With the probe card according to the third embodiment, a plurality of connection terminals that are formed in a coil shape and have axes parallel to one another are applied to the interposer. Therefore, the respective connection terminals move independently from one another and it is possible to cause the interposer to follow deformation of the substrate and the space transformer. As a result, it is possible to prevent a part of wires from breaking because of the deformation of the substrate and the space transformer.

According to the third embodiment, the connection terminals of the interposer include the coil spring member alone. Therefore, less number of components are required compared with the connection terminals applied to the interposer according to the second embodiment. Thus, it is possible to further reduce the cost required for manufacturing and maintenance.

It is possible to apply the interposer 430 explained in the third embodiment as the interposer of the probe card according to the second embodiment. In this case, hole portions for inserting the second screw members through the interposer 430 only have to be formed in predetermined positions.

Other Embodiments

Figure 21:
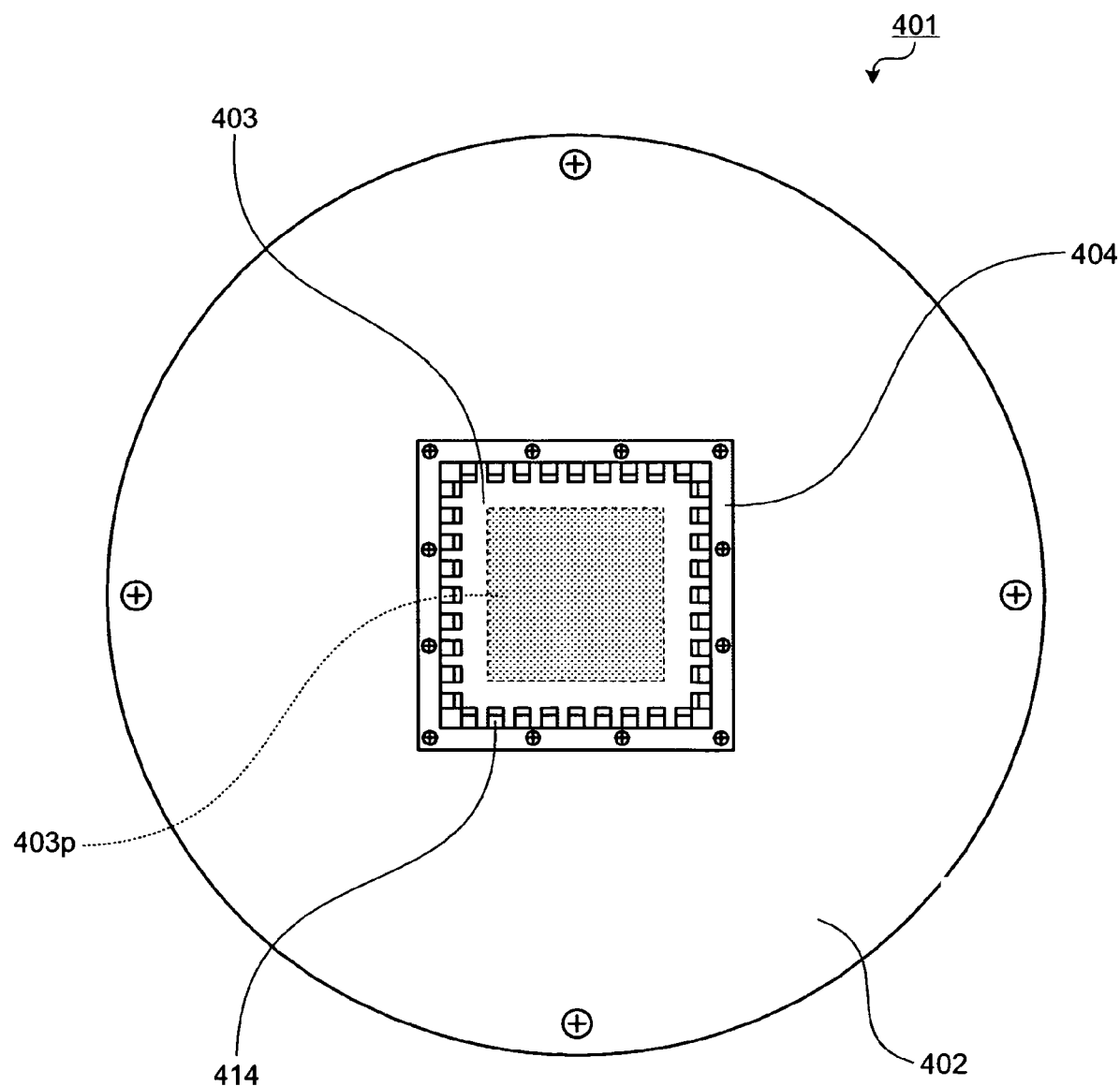
FIG. 21 is a top view of the structure of a probe card according to another embodiment of the present invention.

The first to third embodiments are described above as the best modes for carrying out the present invention; however, the present invention is not to be restricted to them. FIG. 21 is a top view of the structure of a probe card according to another embodiment of the present invention. In a probe card 401 shown in FIG. 21, a probe head 403 having a square surface is held on a substrate 402 of a disc shape by a leaf spring 404 having an outer frame of the same square shape.

In the probe card 401, surfaces of an interposer and a space transformer (not shown) are also formed in a square shape. Pawl portions 414 formed in an inner circumference of the leaf spring 404 are uniformly formed over the entire inner circumference of the probe head 403 and uniformly press the entire circumference near an edge of the surface of the probe head 403 in a direction of the substrate 402. Therefore, it is possible to control, in addition to warp and waviness of the probe head 403, warp and waviness of the interposer and the space transformer. As in the first to third embodiments, it is possible to improve accuracy of the flatness and parallelism of the probe card.

In FIG. 21, a probe housing area 403p in which the probe head 403 houses the probes is formed in a square shape. This is applied, for example, when the probes collectively come into contact with about a half to a quarter of an area of a semiconductor wafer.

In the probe card according to the present invention, the leaf spring only has to uniformly press the entire circumference near an edge of a surface of the probe head, which is a surface on a side where the probes project, in a direction of the substrate. A shape of the probe head is not limited to that described above. For example, the shape of the probe head can be a regular octagonal shape similar to that of the interposer and the space transformer in the first embodiment. In this case, if the leaf spring is formed in a regular octagonal shape similar to that of the probe head and pawl portions are formed in the leaf spring to make it possible to uniformly press the entire circumference including at least respective vertexes of the regular octagonal shape, the same effect can be achieved.

Respective surface shapes of the interposer and the space transformer can be circular similar to the probe head. In this case, the probe card for the FWLT has highest symmetry. Therefore, this is optimum when flatness and parallelism of the probe card is given a top priority.

Besides, the respective surfaces of the interposer and the space transformer can be formed in an appropriate regular polygonal shape and the probe head can be formed in a regular polygonal shape similar to the regular polygonal shape. When the probe head comes into full contact with the semiconductor wafer, the probe head can be circular. In this way, the probe card according to the present invention can include a substrate and a probe head formed in shapes other than a disc shape. The shapes can be changed according to a shape of a test object and an arrangement pattern of electrode pads provided in the test object.

In the above explanation, the probes 2 come into contact with a semiconductor wafer as a test object. However, as the probes applied to the probe card according to the present invention, any of various types of known probes can be applied.

It is obvious from the above description that the invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As described above, the probe card according to the present invention is useful for an electric characteristic test for a semiconductor wafer and is particularly suitable for the FWLT.

The invention claimed is:
1. A probe card that electrically connects a semiconductor wafer as a test object and a circuit structure for generating a signal for a test, the probe card comprising:
  a plurality of probes that are made of a conductive material and come into contact with the semiconductor wafer to receive or output an electric signal;
  a probe head that houses and holds the probes;
  a substrate that is flat and has a wiring pattern corresponding to the circuit structure;
  a reinforcing member that is mounted on the substrate and reinforces the substrate;
  an interposer that is stacked on the substrate for connection of wires of the substrate;
  a space transformer that is interposed and stacked between the interposer and the probe head and transforms intervals among the wires to be connected through the inter- poser, the wires coming out on a surface of the space transformer facing the probe head; and a plurality of first post members that have a height greater than a thickness of the substrate, and are embedded in the substrate from a portion of the substrate on which the interposer is stacked to penetrate through the substrate.

2. The probe card according to claim 1, further comprising a first fastening member for fastening the interposer to the substrate.

3. The probe card according to claim 2, wherein the first fastening member includes at least one first screw member inserted through at least one of the reinforcing member and the interposer.

4. The probe card according to claim 3, wherein
the first post members each include a first hollow portion passing through the first post member in a height direction of the first post member, an inner surface of the first hollow portion being threaded, and
first screw members are screwed into the first hollow portion from openings on both sides of the first hollow portion, respectively.

5. The probe card according to claim 3, wherein
the first post members each include a first hollow portion passing through the first post member in a height direction of the first post member, and
the first screw member is inserted through the first hollow portion from one side of the first hollow portion.

6. The probe card according to claim 1, further comprising:
a holding member that is fixed to the substrate and presses and holds the interposer and the space transformer; and
a leaf spring that is fixed to the holding member and presses an edge portion of a surface of the probe head over entire circumference in a direction of the substrate, the probes projecting from the surface of the probe head.

7. The probe card according to claim 1, wherein the interposer includes
a plurality of connection terminals that are made of a conductive material and resilient in an axial direction of the connection terminals; and
a housing that is made of an insulating material and includes a plurality of hole portions each housing one of the connection terminals.

8. The probe card according to claim 7, wherein the connection terminals each include
a first needle-like member and a second needle-like member each having a tapered tip; and
a spring member that is in a coil shape and resiliently connects the first needle-like member to the second needle-like member such that axial directions of the first needle-like member and the second needle-like member match.

9. The probe card according to claim 8, wherein the spring member includes a tightly wound portion that is bendable in each of the hole portions and, when bent, comes into contact with any one of the first needle-like member and the second needle-like member.

10. The probe card according to claim 7, wherein
the connection terminals are in a coil shape, and each include
a pair of electrode pin portions in each of which a coil is tightly wound to be tapered toward either end in the axial direction; and
a coil spring portion that connects between the electrode pin portions.

11. The probe card according to claim 10, wherein the coil spring portion includes a tightly wound portion that is arranged in a middle, in the axial direction, of each of the connection terminals;
a constantly wound portion that is arranged on a side of the tightly wound portion; and
a loosely wound portion that is arranged on a side of the tightly wound portion other than where the constantly wound portion is arranged, in which a coil is wound more loosely than in the constantly wound portion.

12. The probe card according to claim 1, further comprising a second fastening member for fastening the space transformer to the substrate.

13. The probe card according to claim 12, wherein the second fastening member includes at least one second screw member inserted through at least one of the reinforcing member and the space transformer.

14. The probe card according to claim 13, wherein the second screw member penetrates through the space transformer passing through a center of gravity of the space transformer.

15. The probe card according to claim 13, further comprising second post members equal in number to second screw members, wherein
the second post members have a height equal to the height of the first post members, and are embedded in the substrate from a portion of the substrate on which the interposer is stacked to penetrate through the substrate, each including a second hollow portion passing through the second post member in a height direction of the second post member, an inner surface of the second hollow portion being threaded, and
second screw members are screwed into the second hollow portion from openings on both sides of the second hollow portion, respectively.

16. The probe card according to claim 13, further comprising second post members equal in number to second screw members, wherein
the second post members have a height equal to the height of the first post members, and are embedded in the substrate from a portion of the substrate on which the interposer is stacked to penetrate through the substrate, each including a second hollow portion passing through the second post member in a height direction of the second post member, and
the second screw member is inserted through the second hollow portion from one side of the second hollow portion.

17. The probe card according to claim 13, wherein the second screw member includes
a bolt one end of which is brazed to a surface of the space transformer; and
a nut that is screwed onto another end of the bolt.

18. The probe card according to claim 17, further comprising second post members equal in number to second screw members, wherein
the second post members have a height equal to the height of the first post members, and are embedded in the substrate from a portion of the substrate on which the interposer is stacked to penetrate through the substrate, each including a second hollow portion passing through the second post member in a height direction of the second post member, and
the bolt is inserted through the second hollow portion from one side of the second hollow portion.

19. The probe card according to claim 12, wherein the interposer includes a plurality of connection terminals that are made of a conductive material and resilient in an axial direction of the connection terminals; and a housing that is made of an insulating material and includes a plurality of hole portions each housing one of the connection terminals.

20. The probe card according to claim 19, wherein the connection terminals each include a first needle-like member and a second needle-like member each having a tapered tip; and a spring member that is in a coil shape and resiliently connects the first needle-like member to the second needle-like member such that axial directions of the first needle-like member and the second needle-like member match.

21. The probe card according to claim 20, wherein the spring member includes a tightly wound portion that is bendable in each of the hole portions and, when bent, comes into contact with any one of the first needle-like member and the second needle-like member.

22. The probe card according to claim 19, wherein the connection terminals are in a coil shape, and each include a pair of electrode pin portions in each of which a coil is tightly wound to be tapered toward either end in the axial direction; and a coil spring portion that connects between the electrode pin portions.

23. The probe card according to claim 22, wherein the coil spring portion includes a tightly wound portion that is arranged in a middle, in the axial direction, of each of the connection terminals;

a constantly wound portion that is arranged on a side of the tightly wound portion; and a loosely wound portion that is arranged on a side of the tightly wound portion other than where the constantly wound portion is arranged, in which a coil is wound more loosely than in the constantly wound portion.

* * * * *